US 11,984,394 B2

(12) United States Patent
Nakatsuka et al.

(10) Patent No.: US 11,984,394 B2
(45) Date of Patent: May 14, 2024

(54) SEMICONDUCTOR MEMORY DEVICE HAVING CONTACT PLUGS EXTEND IN THE STACKING DIRECTION OF THE PLURALITY OF THE FIRST AND SECOND CONDUCTIVE LAYERS

(71) Applicant: Kioxia Corporation, Minato-ku (JP)

(72) Inventors: Keisuke Nakatsuka, Kobe (JP); Yasuhito Yoshimizu, Yokkaichi (JP); Tomoya Sanuki, Yokkaichi (JP); Fumitaka Arai, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 376 days.

(21) Appl. No.: 17/438,728

(22) PCT Filed: Mar. 19, 2019

(86) PCT No.: PCT/JP2019/011585
§ 371 (c)(1),
(2) Date: Sep. 13, 2021

(87) PCT Pub. No.: WO2020/188775
PCT Pub. Date: Sep. 24, 2020

(65) Prior Publication Data
US 2022/0130754 A1   Apr. 28, 2022

(51) Int. Cl.
H10B 41/27     (2023.01)
H01L 23/522    (2006.01)
(Continued)

(52) U.S. Cl.
CPC ........ H01L 23/5226 (2013.01); H01L 23/535 (2013.01); H10B 41/27 (2023.02); H10B 43/27 (2023.02)

(58) Field of Classification Search
CPC ... H01L 23/5226; H01L 23/535; H10B 41/27; H10B 43/27
(Continued)

(56) References Cited

U.S. PATENT DOCUMENTS 8,742,586 B2   6/2014 Mizukami et al.
9,748,268 B1   8/2017 Arai
(Continued)

FOREIGN PATENT DOCUMENTS

CN    108573959 A    9/2018
JP    2009-16400 A   1/2009
(Continued)

OTHER PUBLICATIONS

International Search Report dated Jun. 11, 2019 in PCT/JP2019/011585 filed on Mar. 19, 2019, 1 page.

Primary Examiner — Hoai V Pham
(74) Attorney, Agent, or Firm — Oblon, McClelland, Maier & Neustadt, L.L.P.

(57) ABSTRACT

A semiconductor memory device including: plural first conductive layers stacked on a substrate; plural second conductive layers each stacked between the first conductive layers; a pillar that extends in a stacking direction of the first and second conductive layers and forms plural memory cells at intersections of the first and second conductive layers in a region where first and second conductive layers are arranged; a first contact plug that extends in the stacking direction of the first and second conductive layers and is connected to the first conductive layers in the region where the first and second conductive layers are arranged; and a second contact plug that extends in the stacking direction of the first and second conductive layers and is connected to the (Continued)

second conductive layers in the region where the first conductive layers and second conductive layers are arranged.

5 Claims, 28 Drawing Sheets

(51) Int. Cl.
*H01L 23/535* (2006.01)
*H10B 43/27* (2023.01)

(58) Field of Classification Search
USPC .......................................................... 257/314
See application file for complete search history.

(56) References Cited

U.S. PATENT DOCUMENTS

| | | |
|---|---|---|
| 9,768,233 B1 | 9/2017 | Fukuda et al. |
| 10,141,372 B2 | 11/2018 | Park et al. |
| 10,297,578 B2 | 5/2019 | Tagami et al. |
| 10,741,527 B2 | 8/2020 | Tagami et al. |
| 11,270,980 B2 | 3/2022 | Tagami et al. |
| 2010/0032725 A1 | 2/2010 | Baba et al. |
| 2011/0057251 A1 | 3/2011 | Higashi |
| 2015/0221667 A1 | 8/2015 | Fukuzumi et al. |
| 2016/0079259 A1* | 3/2016 | Son ..................... H10B 43/27 257/401 |
| 2017/0053935 A1 | 2/2017 | Fukuzumi et al. |
| 2017/0077025 A1 | 3/2017 | Akutsu |
| 2017/0110402 A1 | 4/2017 | Smith et al. |
| 2018/0261529 A1 | 9/2018 | Yoshimizu et al. |
| 2018/0261575 A1 | 9/2018 | Tagami et al. |
| 2018/0277596 A1 | 9/2018 | Mori |
| 2019/0027494 A1 | 1/2019 | Fukuzumi et al. |
| 2019/0312012 A1 | 10/2019 | Tagami et al. |
| 2020/0043944 A1 | 2/2020 | Fukuzumi et al. |
| 2020/0335517 A1 | 10/2020 | Fukuzumi et al. |
| 2020/0350291 A1 | 11/2020 | Tagami et al. |
| 2022/0157784 A1 | 5/2022 | Tagami et al. |

FOREIGN PATENT DOCUMENTS

| | | |
|---|---|---|
| JP | 2010-40977 A | 2/2010 |
| JP | 4922370 B2 | 4/2012 |
| JP | 2018-148071 A | 9/2018 |
| JP | 2018-152412 A | 9/2018 |
| TW | 1582953 B | 5/2017 |
| TW | 201721827 A | 6/2017 |
| TW | 201826507 A | 7/2018 |

\* cited by examiner

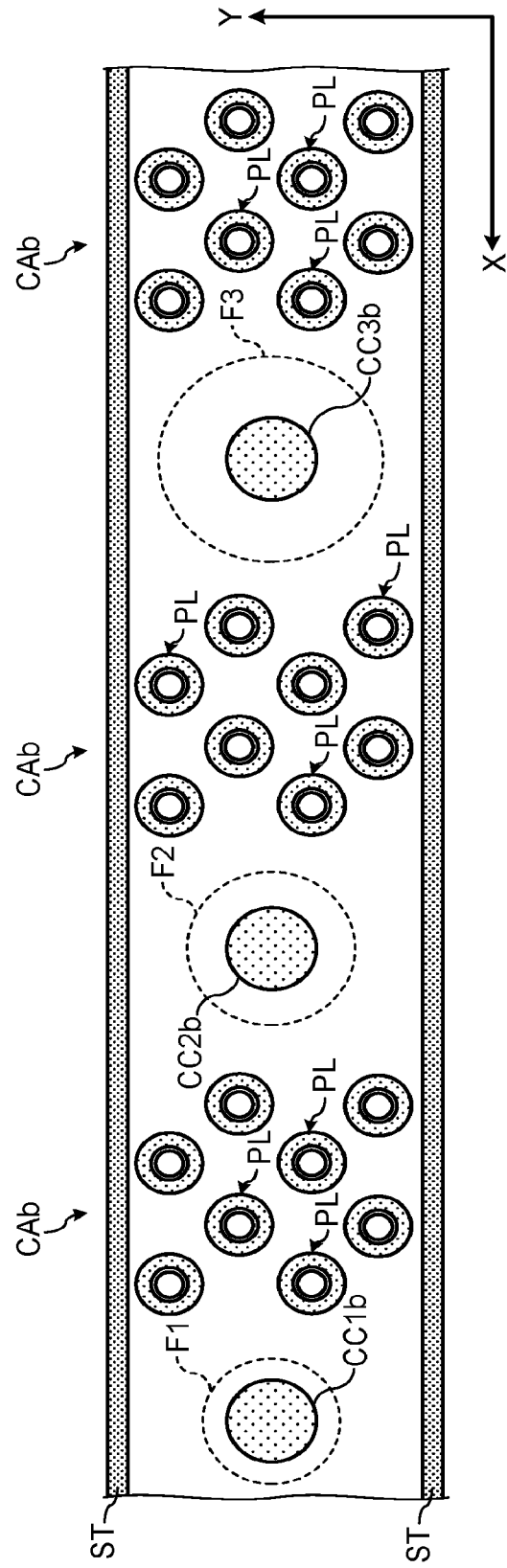

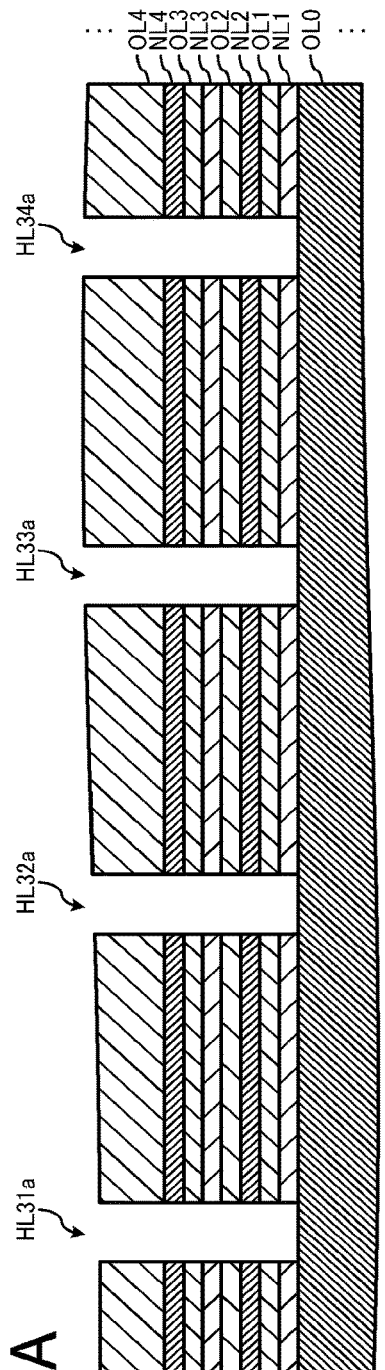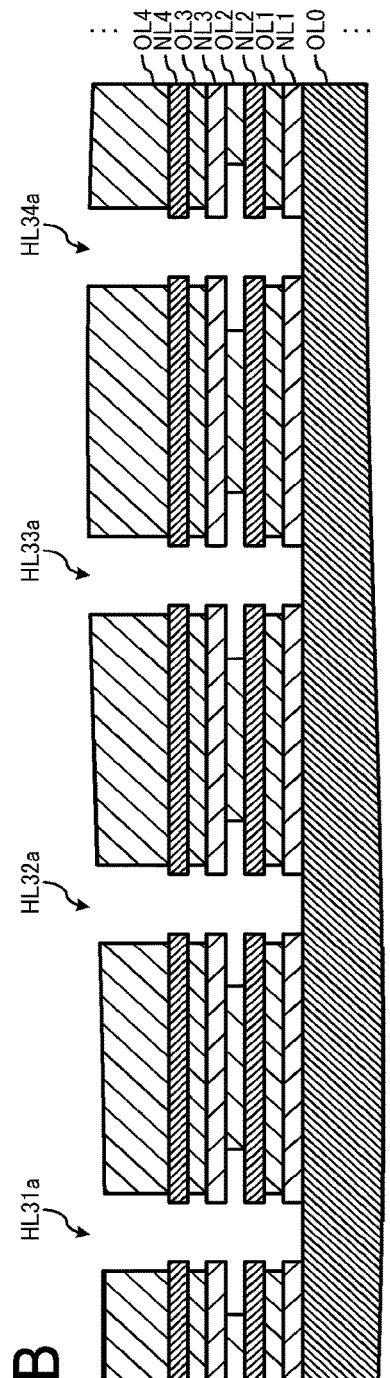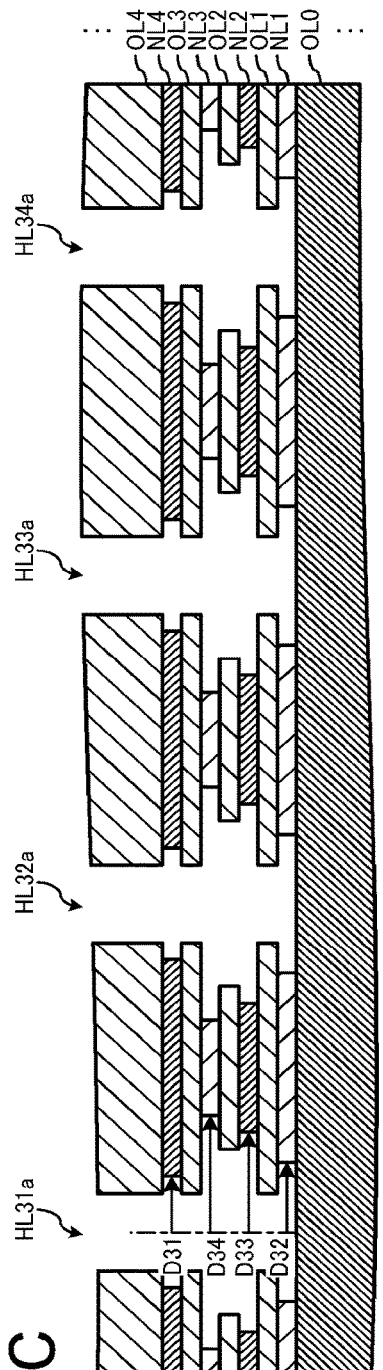

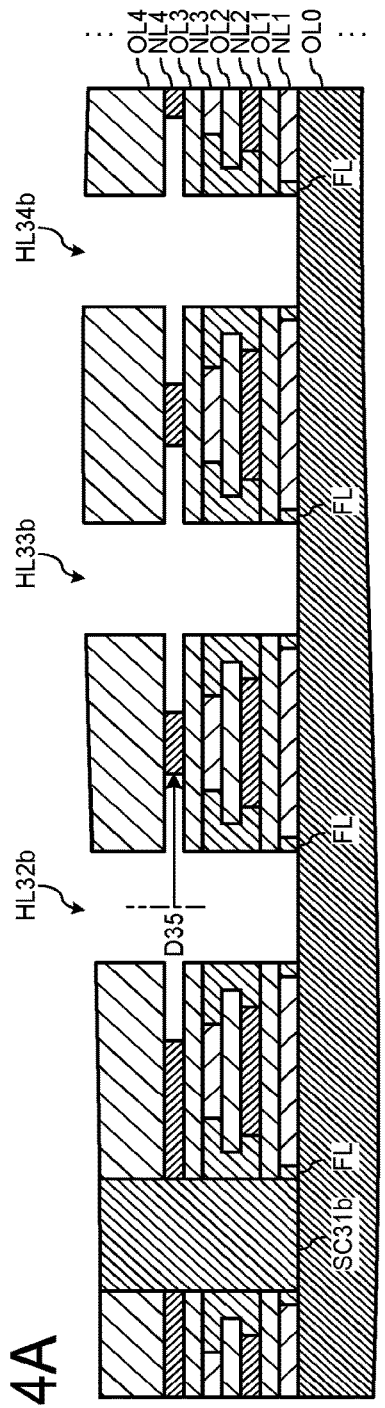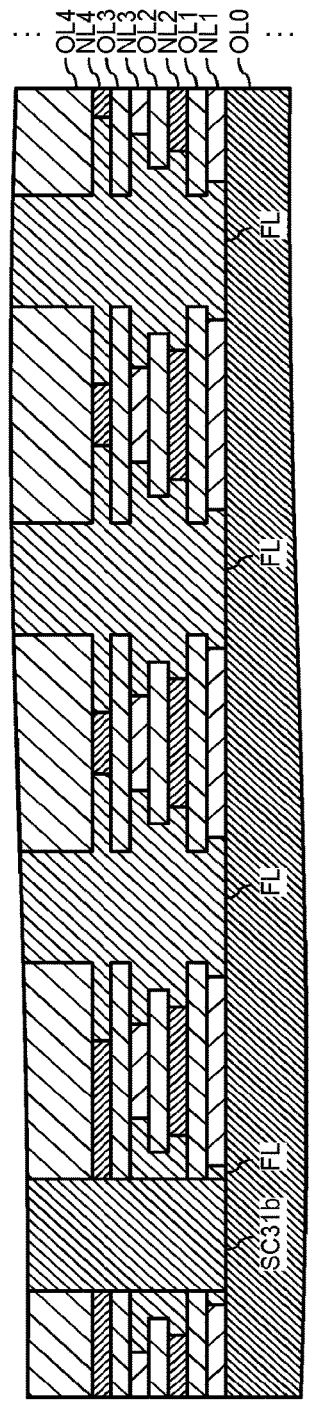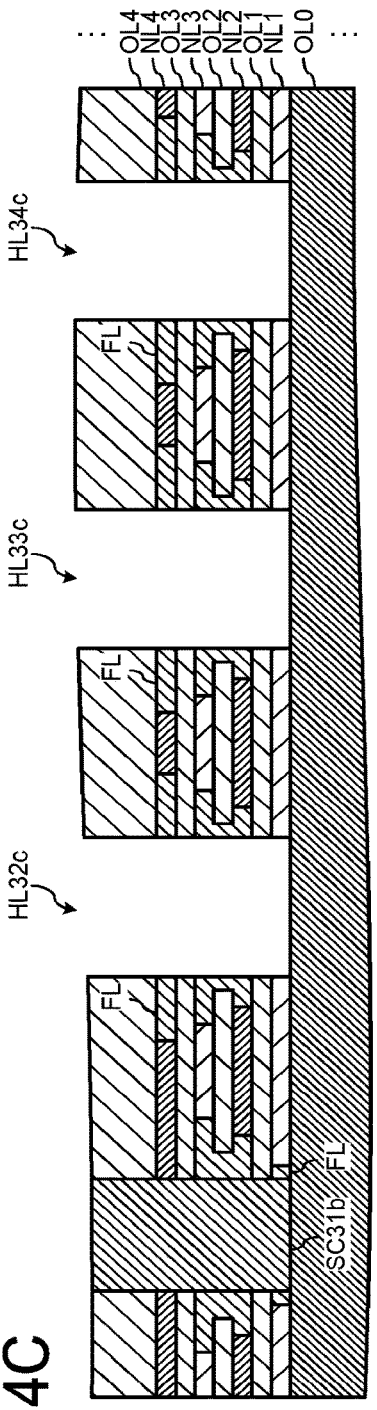

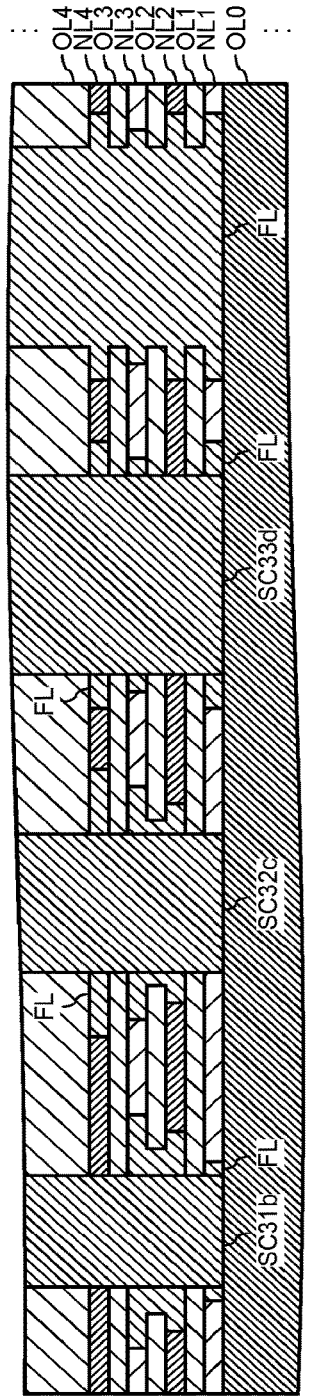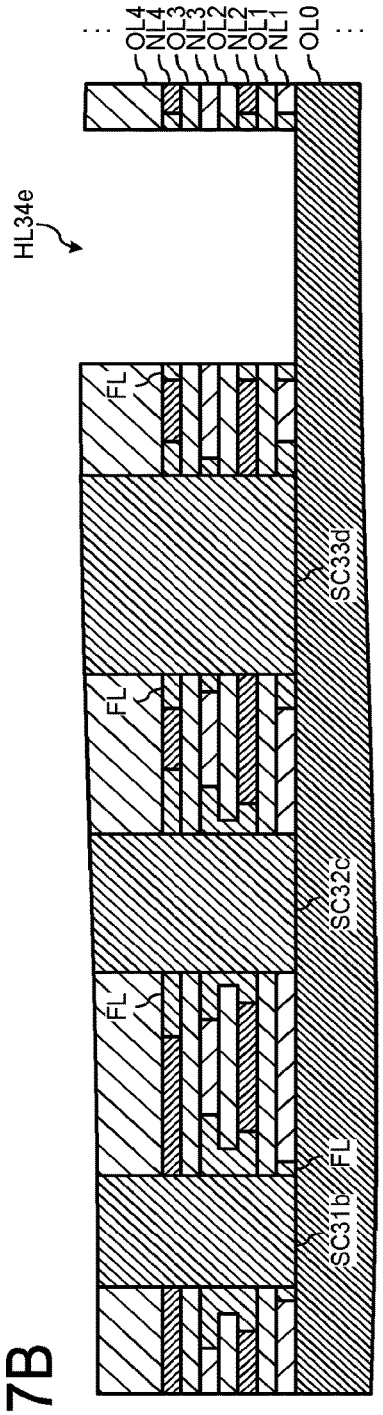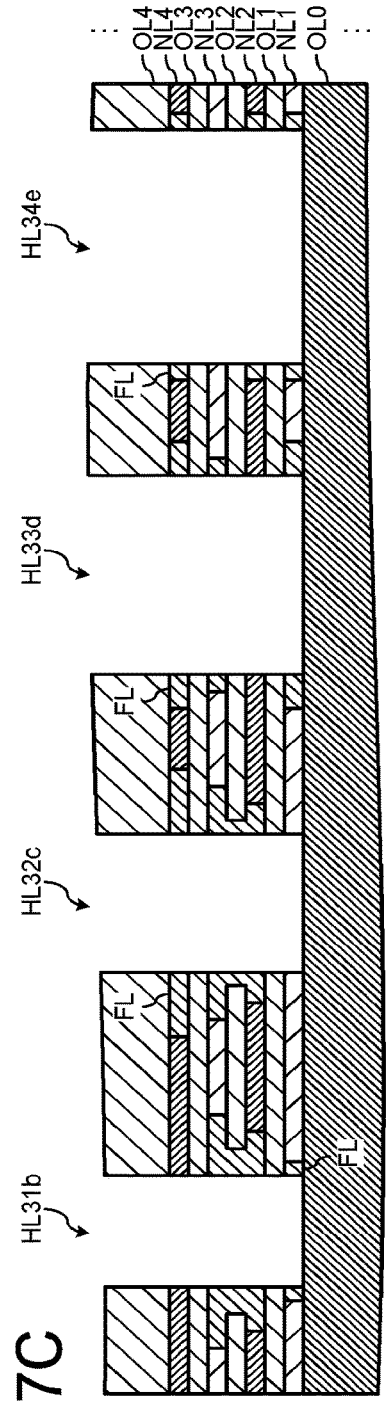

SEMICONDUCTOR MEMORY DEVICE HAVING CONTACT PLUGS EXTEND IN THE STACKING DIRECTION OF THE PLURALITY OF THE FIRST AND SECOND CONDUCTIVE LAYERS

CROSS-REFERENCE TO RELATED APPLICATIONS

This application is a national stage application of International Application No. PCT/JP2019/011585, filed Mar. 19, 2019, which designates the United States, and which is incorporated herein by reference.

FIELD

Embodiments of the present invention relate to a semiconductor memory device.

BACKGROUND

In recent years, in accordance with miniaturization of a semiconductor memory device, a three-dimensional nonvolatile memory including memory cells having a stacked structure has been proposed. In the three-dimensional nonvolatile memory, a step-shaped structure is adopted in order to lead out a word line in each of layers of the memory cells arranged in a height direction in some cases.

SUMMARY OF INVENTION

Problem to be Solved by the Invention

An object of one embodiment is to provide a semiconductor memory device capable of connecting a plurality of word lines to one contact and leading out the word lines.

Means for Solving Problem

A semiconductor memory device of an embodiment includes: a plurality of first conductive layers stacked on a substrate; a plurality of second conductive layers each stacked between the first conductive layers; a pillar that extends in a stacking direction of the plurality of first conductive layers and the plurality of second conductive layers and forms a plurality of memory cells at intersections of the plurality of first conductive layers and the plurality of second conductive layers in a region where the plurality of first conductive layers and the plurality of second conductive layers are arranged; a first contact plug that extends in the stacking direction of the plurality of first conductive layers and the plurality of second conductive layers and is connected to the plurality of first conductive layers in the region where the plurality of first conductive layers and the plurality of second conductive layers are arranged; and a second contact plug that extends in the stacking direction of the plurality of first conductive layers and the plurality of second conductive layers and is connected to the plurality of second conductive layers in the region where the plurality of first conductive layers and the plurality of second conductive layers are arranged.

BRIEF DESCRIPTION OF DRAWINGS

FIG. 14 is a view schematically illustrating an example of a configuration of contact plugs included in a semiconductor memory device according to a second modification of the first embodiment.

FIGS. 22A to 22C are views illustrating an example of a procedure of a method of manufacturing a semiconductor memory device according to a modification of the second embodiment.

FIGS. 24A to 24C are views illustrating an example of a procedure of a method of manufacturing a semiconductor memory device according to a modification of the second embodiment.

FIGS. 27A to 27C are views illustrating an example of a procedure of a method of manufacturing a semiconductor memory device according to a modification of the second embodiment.

DESCRIPTION OF EMBODIMENTS

Hereinafter, the present invention will be described in detail with reference to the drawings. Note that the present invention is not limited by the following embodiments. In addition, constituent elements in the following embodiments include those that can be easily assumed by those skilled in the art or those that are substantially the same.

First Embodiment

A semiconductor memory device of a first embodiment will be described with reference to FIGS. 1 to 14.
(Configuration Example of Semiconductor Memory Device)

Figure 1:
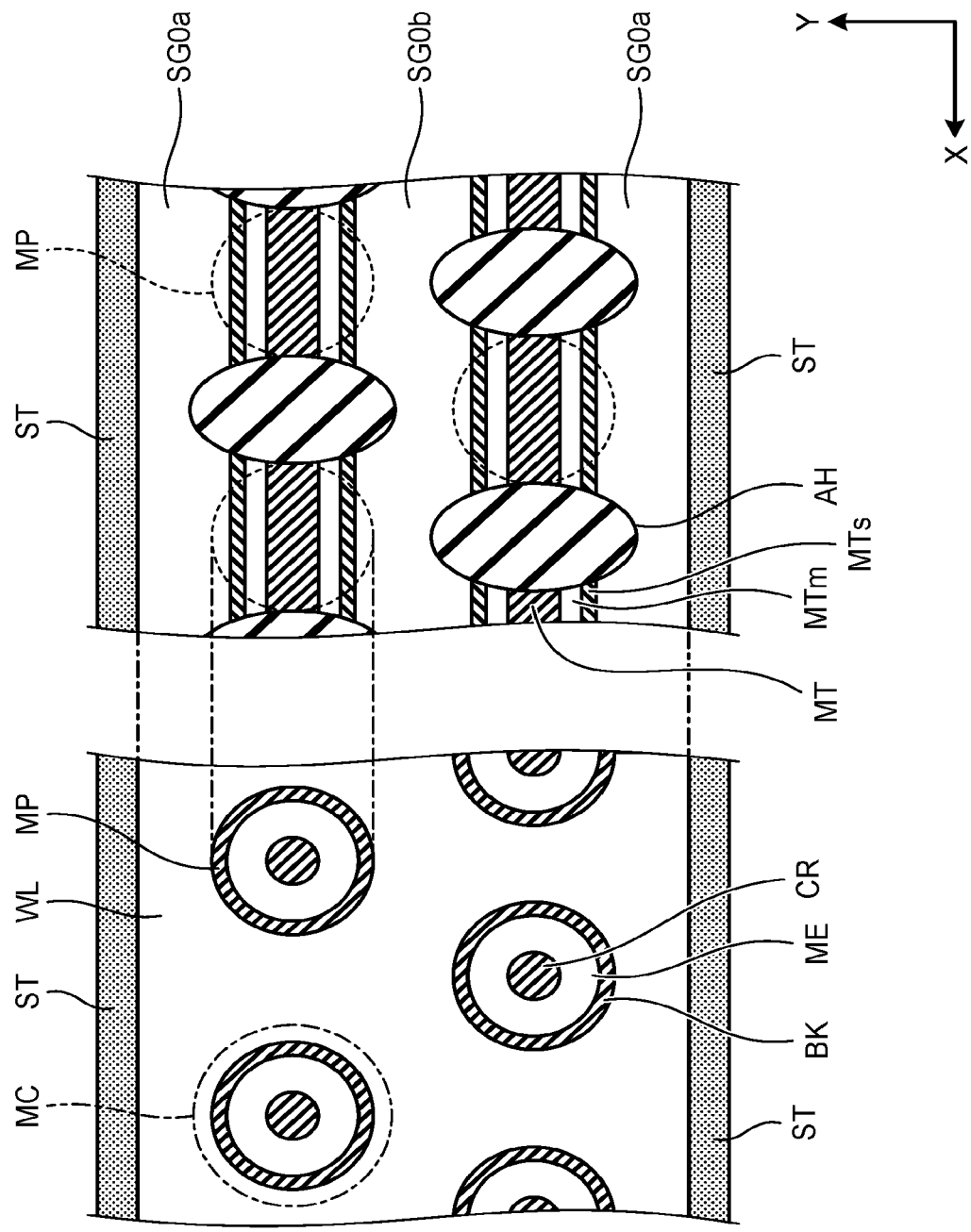
FIG 1 is a cross-sectional view schematically illustrating an example of a configuration of a semiconductor memory device according to a first embodiment.

FIG. 1 is a cross-sectional view schematically illustrating an example of a configuration of a semiconductor memory device 1 according to the first embodiment. The right view of FIG. 1 is a cross-sectional view of a select gate line SG0 included in the semiconductor memory device 1, and the left view of FIG. 1 is a cross-sectional view of any one of word lines WL included in the semiconductor memory device 1.

Figure 2:
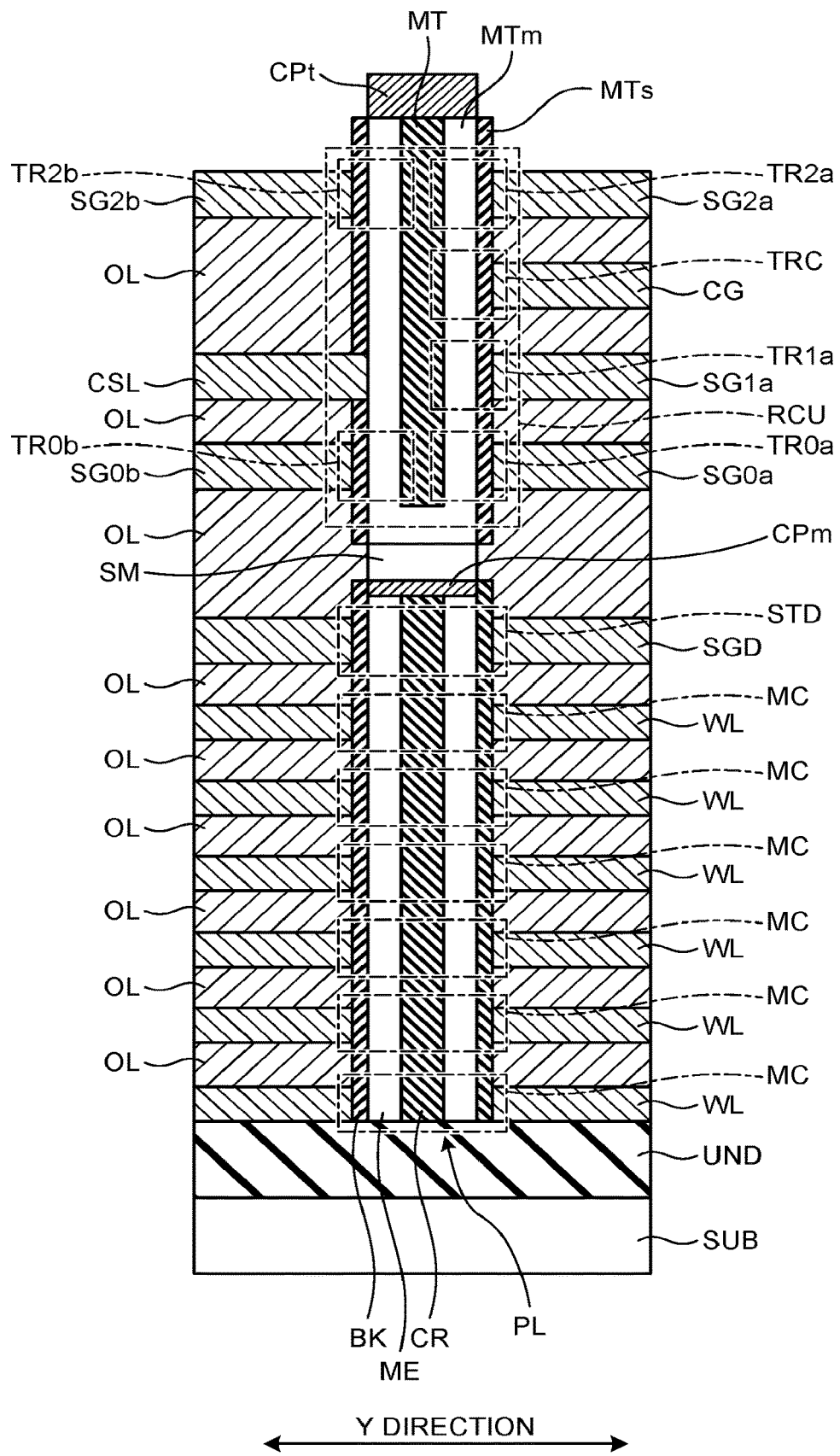
FIG. 2 is a longitudinal sectional view schematically illustrating an example of a configuration of the semiconductor memory device according to the first embodiment.

FIG. 2 is a longitudinal sectional view schematically illustrating an example of a configuration of the semiconductor memory device 1 according to the first embodiment. FIG. 2 is a cross-sectional view of the semiconductor memory device 1 in a Y direction.

As illustrated in FIGS. 1 and 2, the semiconductor memory device 1 includes a plurality of word lines WL, a plurality of select gate lines SG, a control gate line CG, and a cell source line CSL stacked on a substrate SUB such as a silicon substrate with an insulating layer UND interposed therebetween. Insulating layers OL are interposed between the word lines WL, the select gate lines SG, the control gate line CG, and the cell source line CSL, respectively. Each of the word line WL, the select gate line SG, the control gate line CG, and the cell source line CSL is, for example, a tungsten layer or the like. The insulating layer OL is, for example, a $SiO_2$ layer or the like.

More specifically, the insulating layer UND is arranged on the substrate SUB. The plurality of word lines WL as conductive layers are arranged on the insulating layer UND with each of the insulating layers OL interposed therebetween. A select gate line SGD on a drain side is arranged on the word line WL. The plurality of select gate lines SG are arranged on the select gate line SGD with each of the insulating layers OL interposed therebetween. However, these select gate lines SG are divided in the Y direction by a division layer MT to be described below, and the cell source line CSL is arranged on at least one side in the Y direction. In addition, for example, one control gate line CG is disposed between select gate lines SG1a and SG2a on a side opposite to the cell source line CSL in the Y direction.

Note that the number of each of stacked word lines WL, select gate lines SG, control gate lines CG, and cell source lines CSL is arbitrary.

A region where the word line WL, the select gate line SG, the control gate line CG, and the cell source line CSL are arranged is divided in the Y direction by a plurality of slits ST extending in an X direction. The slit ST has a groove-like structure that penetrates from the select gate line SG of the uppermost layer to the word line WL of the lowermost layer and reaches the substrate SUB. The slit ST is filled with a conductive material using, for example, an insulating layer as a liner, and the slit ST functions as, for example, a source line contact.

In a region where the word lines WL and the select gate line SGD are arranged and interposed between two slits ST, a plurality of pillars PL extending in a stacking direction of the word lines WL and the select gate line SGD and reaching the insulating layer UND on the substrate SUB are arranged in a matrix. The pillar PL includes a core layer CR, an oxide semiconductor layer ME, and an insulating layer BK in this order from the central axis of the pillar PL. The core layer CR is, for example, a $SiO_2$ layer or the like. The oxide semiconductor layer ME is an oxide semiconductor layer containing, for example, at least one of indium (In), gallium (Ga), zinc (Zn), and tin (Sn). More specifically, the oxide semiconductor layer ME may be, for example, an InGaZnO layer, an InGaSnO layer, or the like. The insulating layer BK is, for example, a $SiO_2$ layer, a SiON layer, a layer formed of a high dielectric constant material, or the like. Examples of the high dielectric constant material can include aluminum oxide, hafnium oxide, and zirconium oxide.

A semiconductor layer SM is arranged at an upper end of the pillar PL with a cap layer CPm interposed therebetween. The cap layer CPm is formed of the same material as that of the oxide semiconductor layer ME described above. The semiconductor layer SM is, for example, a polysilicon layer or the like.

With such a configuration, each of memory cells MC is formed at an intersection of the word line WL and the pillar PL. By applying a predetermined voltage from a word line driver or the like (not illustrated) arranged in another region of the substrate SUB to the memory cell MC via the word line WL, charges are stored in a charge storage layer CH of the memory cell MC, and data is stored in the memory cell MC in a nonvolatile manner. By applying a predetermined voltage from the word line driver or the like to the memory cell MC via the word line WL, data stored in the memory cell MC can be read.

As described above, the semiconductor memory device 1 is configured as, for example, a three-dimensional nonvolatile memory in which the memory cells MC are threedimensionally arranged. A region where a plurality of memory cells MC are arranged is referred to as a cell array region.

A select gate STD is formed at an intersection of the select gate line SGD and the pillar PL. By applying a predetermined voltage from the select gate line SGD to the select gate STD, the select gate STD is turned on or off, and all the memory cells MC in the pillar PL to which the select gate STD belongs can be brought into a selected state or a non-selected state.

At a height position where the plurality of select gate lines SG are arranged, the select gate lines SG above the pillar PL are divided in the Y direction by the division layer MT, semiconductor layers MTm arranged on both sides of the division layer MT in the Y direction, and insulating layers MTs arranged on both sides of the division layer MT and the semiconductor layers MTm in the Y direction. In addition, the division layer MT, the semiconductor layer MTm, and the insulating layer MTs are divided in the X direction by a hole AH filled with an insulating layer such as a $SiO_2$ layer. Each of the division layer MT and the insulating layer Ms is, for example, a $SiO_2$ layer, a SiN layer, a SiON layer, a layer formed of a high dielectric constant material, or the like. The semiconductor layer MTm is, for example, a polysilicon layer, a poly-germanium layer, a poly-silicon-poly-germanium layer, an oxide semiconductor layer, a two-dimensional semiconductor material layer, or the like. Examples of a two-dimensional semiconductor material can include $MoS_2$ and $WSe_2$. Therefore, the select gate line SG is connected to the division layer MT, the semiconductor layer MTm, and the insulating layer MTs from both sides in the Y direction, and five transistors TR are formed on both sides in the Y direction.

The cell source line CSL penetrates the insulating layer MTs and is connected to the semiconductor layer MTm.

The control gate line CG is connected to the division layer MT, the semiconductor layer MTm, and the insulating layer MTs from the side opposite to the cell source line CSL in the Y direction. Therefore, one transistor TRC is formed on one side in the Y direction.

The five transistors TR and one transistor TRC form a readout circuit unit RCU. For example, a plug CPt connected to an upper bit line (not illustrated) is arranged on the readout circuit unit RCU.

The semiconductor memory device 1 can operate as, for example, a shift register type memory by the readout circuit RCU. In this case, the shift register type memory is, for example, a memory configured to forward data between the memory cells MC in a predetermined pillar PL.

In the semiconductor memory device 1 as a shift register type memory, charges are sent from a bit line (not illustrated) to the readout circuit unit RCU at the time of writing. The readout circuit unit RCU sequentially transfers charges to an upper portion of the cell array region where the memory cells MC are arranged by controlling a gate potential of each of the transistors TR and TRC. The transferred charges are sequentially transferred toward the lower memory cell MC by sequentially displacing the potentials of the word lines WL in the cell array region. By such a writing operation, 1 is written to the memory cell MC in which a charge is retained and 0 is written to the memory cell MC in which a charge is not retained among the plurality of memory cells MC arranged in a vertical direction of the pillar PL. Note that a direction in which the charge is transferred at the time of writing may be reversed in the vertical direction.

As described above, at the time of reading data written to each of the memory cells MC, the potentials of the word lines WL in the cell array region are sequentially displaced. Therefore, charges between the memory cells MC are sequentially transferred toward the readout circuit unit RCU above the cell array region. The charges transferred toward the readout circuit unit RCU are drawn into select gate lines $SG0a$ and $SG1a$ and the like via the semiconductor layer SM, and are transferred to the semiconductor layer MTm immediately below the control gate CG. In this case, since the potential of the semiconductor layer MTm is changed between the case where the write data is 1 and the case where the write data is 0, the potential of the semiconductor layer MTm between the cell source line CSL and the select gate line $SG2b$ is changed via the insulating layer MTs according to the potential. The change of the potential can be read as an electric resistance between the cell source line CSL and the bit line, and a small amount of transferred charge can be amplified to a relatively large current change.

As described above, by arranging the readout circuit unit RCU on each the pillars PL, transfer of weak charges and reading of the charges can be performed. In addition, unlike a normal NAND memory or the like, the word line WL in the shift register type memory does not control writing and reading for each bit, and performs charge transfer between adjacent memory cells MC. Therefore, it is preferable that potential modulation can be performed between the adjacent word lines WL, and for example, a plurality of word lines WL not adjacent to each other can be bundled into several sets and connected to one word line driver. Note that the select gate line SGD connected to the select gate STD is individually connected to a row decoder (not illustrated).

Figure 3A:
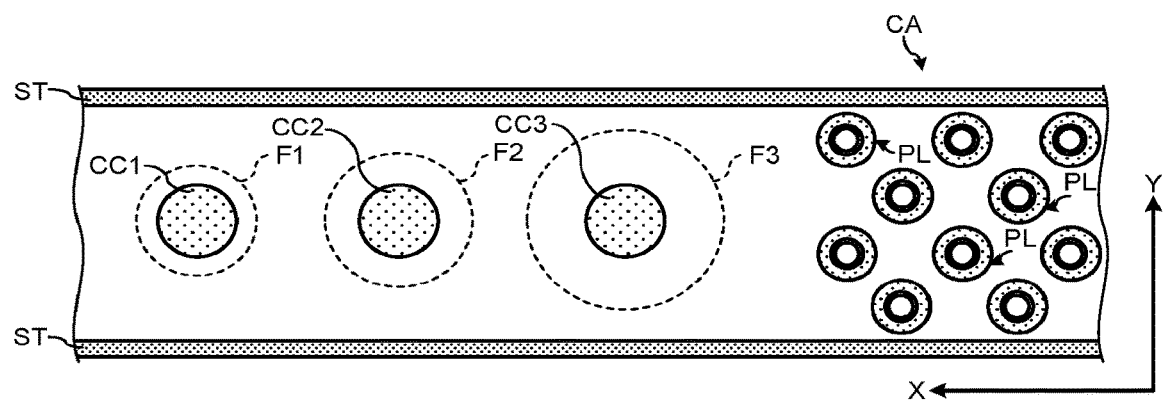
FIGS. 3A and 3B are views schematically illustrating an example of a configuration of contact plugs included in the semiconductor memory device according to the first embodiment.
Figure 3B:
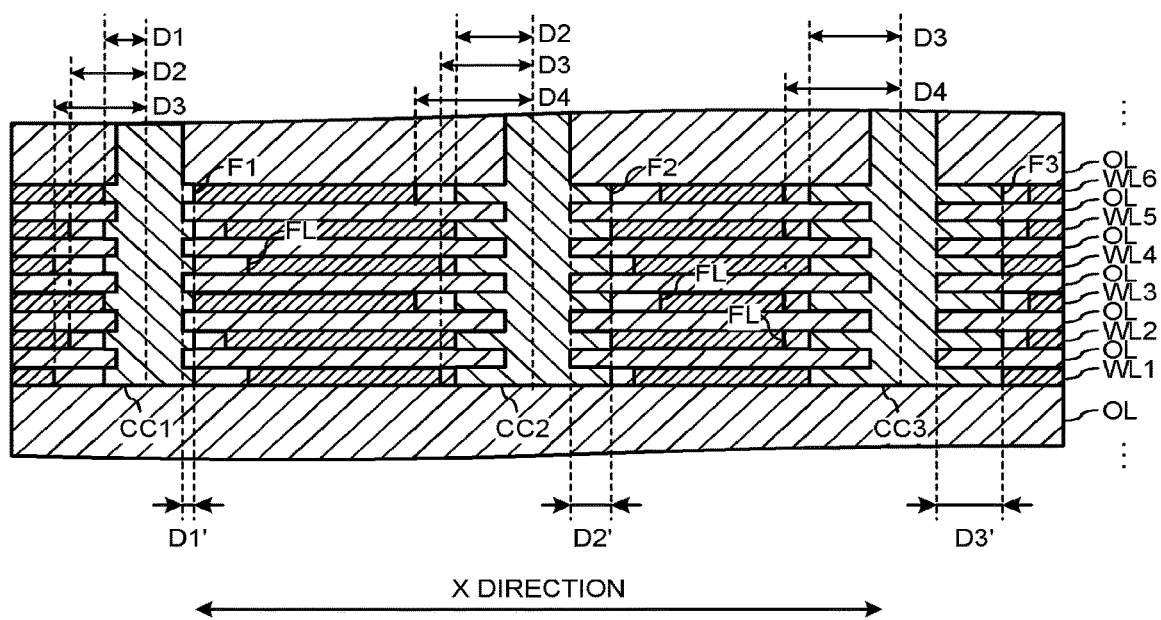

FIGS. 3A and 3B illustrate configurations of contact plugs CC1 to CC3 that apply a voltage from the word line driver to the word line WL.

FIGS. 3A and 3B are views schematically illustrating an example of the configuration of the contact plugs CC1 to CC3 included in the semiconductor memory device 1 according to the first embodiment. FIG. 3A is a cross-sectional view illustrating any one of the word lines WL included in the semiconductor memory device 1, and FIG. 3B is a longitudinal sectional view of the contact plugs CC1 to CC3 in the X direction. Note that upper and lower configurations of the word line WL are omitted in FIG. 3B. In addition, in FIG. 3B, for convenience, a word line WL1, a word line WL2, a word line WL3, ..., and the like are arranged in this order from the word line WL closest to the substrate SUB.

As illustrated in FIGS. 3A and 3B, the contact plugs CC1 to CC3 are arranged, for example, side by side in the X direction outside a cell array region CA where the memory cells MC are arranged by the plurality of pillars PL.

The contact plugs CC1 to CC3 penetrate the word lines WL1 to WL6 and the insulating layers OL arranged therebetween, and extend in the stacking direction of the word lines WL1 to WL6. Each of upper ends of the contact plugs CC1 to CC3 is connected to the word line driver via a plug, an upper layer wire, and the like (not illustrated). Each of the contact plugs CC1 to CC3 has, for example, a circular cross-sectional shape. Diameters of the contact plugs CC1 to CC3 are substantially equal to each other. Each of the contact plugs CC1 to CC3 is formed of, for example, tungsten or the like.

The contact plug CC1 includes a flange F1 as a protrusion protruding from a side surface of the contact plug CC1 at a height position of each of the word lines WL1 to WL6. The flange F1 has a circular cross-sectional shape having a diameter larger than the diameter of the contact plug CC1. A radius of the flange F1 is a distance D1. In other words, a protrusion amount of the flange F1 from the side surface of the contact plug CC1 is a distance D1'.

The word lines WL1 to WL6 surrounding the periphery of the contact plug CC1 are separated from the central axis of the contact plug CC1 by a predetermined distance. For example, the word lines WL3 and WL6 are separated from the central axis of the contact plug CC1 by the distance D1. The word lines WL2 and WL5 are separated from the central axis of the contact plug CC1 by a distance D2 longer than the distance D1. The word lines WL1 and WL4 are separated from the central axis of the contact plug CC1 by a distance D3 longer than the distance D2. In other words, the word lines WL3 and WL6 are separated from the side surface of the contact plug CC1 by the distance D1'. All of the word lines WL1, WL2, WL4, and WL5 are separated from the side surface of the contact plug CC1 by a distance longer than the distance D1'.

Therefore, each of the flanges F1 included in the contact plug CC1 reaches positions of end portions of the word lines WL3 and WL6 surrounding the contact plug CC1 in a top view. Accordingly, the contact plug CC1 is connected to the word lines WL3 and WL6 via the flanges F1 at the height positions of the word lines WL3 and WL6.

Each of the flanges F1 included in the contact plug CC1 does not reach positions of end portions of the word lines WL1, WL2, WL4, and WL5 surrounding the contact plug CC1 in the top view. That is, the flanges F1 at the height positions of the word lines WL1, WL2, WL4, and WL5 are not in contact with the word lines WL1, WL2, WL4, and WL5. A gap between these flanges F1 and the end portions of the word lines WL1, WL2, WL4, and WL5 is filled with an insulating layer FL. The insulating layer FL is, for example, a SiO$_2$ layer or the like.

The contact plug CC2 includes a flange F2 as a protrusion protruding from a side surface of the contact plug CC2 at a height position of each of the word lines WL1 to WL6. The flange F2 has a circular cross-sectional shape having a diameter larger than the diameter of the contact plug CC2. A radius of the flange F2 is the distance D2. In other words, a protrusion amount of the flange F2 from the side surface of the contact plug CC2 is a distance D2' longer than the distance D1'.

The word lines WL1 to WL6 surrounding the periphery of the contact plug CC2 are separated from the central axis of the contact plug CC2 by a predetermined distance. For example, the word lines WL2 and WL5 are separated from the central axis of the contact plug CC2 by the distance D2. The word lines WL1 and WL4 are separated from the central axis of the contact plug CC2 by the distance D3. The word lines WL3 and WL6 are separated from the central axis of the contact plug CC2 by a distance D4 longer than the distance D3. In other words, the word lines WL2 and WL5 are separated from the side surface of the contact plug CC2 by the distance D2'. All of the word lines WL1, WL3, WL4, and WL6 are separated from the side surface of the contact plug CC2 by a distance longer than the distance D2'.

Therefore, each of the flanges F2 included in the contact plug CC2 reaches the positions of the end portions of the word lines WL2 and WL5 surrounding the contact plug CC2 in the top view. Accordingly, the contact plug CC2 is connected to the word lines WL2 and WL5 via the flanges F2 at the height positions of the word lines WL2 and WL5.

Each of the flange F2 and the flange F2 included in the contact plug CC2 does not reach the positions of the end portions of the word lines WL1, WL3, WL4, and WL6 surrounding the contact plug CC2 in the top view. That is, the flanges F2 at the height positions of the word lines WL1, WL3, WL4, and WL6 are not in contact with the word lines WL1, WL3, WL4, and WL6. A gap between these flanges F2 and the end portions of the word lines WL1, WL3, WL4, and WL6 is filled with an insulating layer FL.

The contact plug CC3 includes a flange F3 as a protrusion protruding from a side surface of the contact plug CC3 at a height position of each of the word lines WL1 to WL6. The flange F3 has a circular cross-sectional shape having a diameter larger than the diameter of the contact plug CC3. A radius of the flange F3 is the distance D3. In other words, a protrusion amount of the flange F3 from the side surface of the contact plug CC3 is a distance D3' longer than the distance D2'.

The word lines WL1 to WL6 surrounding the periphery of the contact plug CC3 are separated from the central axis of the contact plug CC3 by a predetermined distance. For example, the word lines WL1 and WL4 are separated from the central axis of the contact plug CC3 by the distance D3. The word lines WL2, WL3, WL5, and WL6 are separated from the central axis of the contact plug CC3 by the distance D4. In other words, the word lines WL1 and WL4 are separated from the side surface of the contact plug CC3 by the distance D3'. All of the word lines WL2, WL3, WL5, and WL6 are separated from the side surface of the contact plug CC3 by a distance longer than the distance D3'.

Therefore, each of the flanges F3 included in the contact plug CC3 reaches the positions of the end portions of the word lines WL1 and WL4 surrounding the contact plug CC3 in the top view. Accordingly, the contact plug CC3 is connected to the word lines WL1 and WL4 via the flanges F3 at the height positions of the word lines WL1 and WL4.

The flanges F3 included in the contact plug CC3 do not reach the positions of the end portions of the word lines WL2, WL3, WL5, and WL6 surrounding the contact plug CC3 in the top view. That is, the flanges F3 at the height positions of the word lines WL2, WL3, WL5, and WL6 are not in contact with the word lines WL2, WL3, WL5, and WL6. A gap between these flanges F3 and the end portions of the word lines WL2, WL3, WL5, and WL6 is filled with an insulating layer FL.

As described above, all of the word lines WL1 to WL6 are connected to any one of the three contact plugs CC1 to CC3. In addition, the word lines WL adjacent in the stacking direction are connected to the contact plugs CC1 to CC3 different from each other among the three contact plugs CC1 to CC3. That is, the (3n+3)th (n is an integer of 0 or more) word line WL when counted from the substrate SUB side is connected to the contact plug CC1. The (3n+2)th word line WL when counted from the substrate SUB side is connected to the contact plug CC2. The (3n+1)th word line WL when counted from the substrate SUB side is connected to the contact plug CC3.

Note that the select gate line SGD arranged above the word line WL, that is, near the upper end of the pillar PL is connected to a contact different from the contact plugs CC1 to CC3, and is connected to a row decoder individually provided as described above.

(Example of Method of Manufacturing Semiconductor Memory Device)

Next, an example of a method of manufacturing the semiconductor memory device 1 will be described with reference to FIGS. 4A to 12B. FIGS. 4A to 12B are views each illustrating an example of a procedure of the method of manufacturing the semiconductor memory device 1 according to the first embodiment.

Figure 4A:
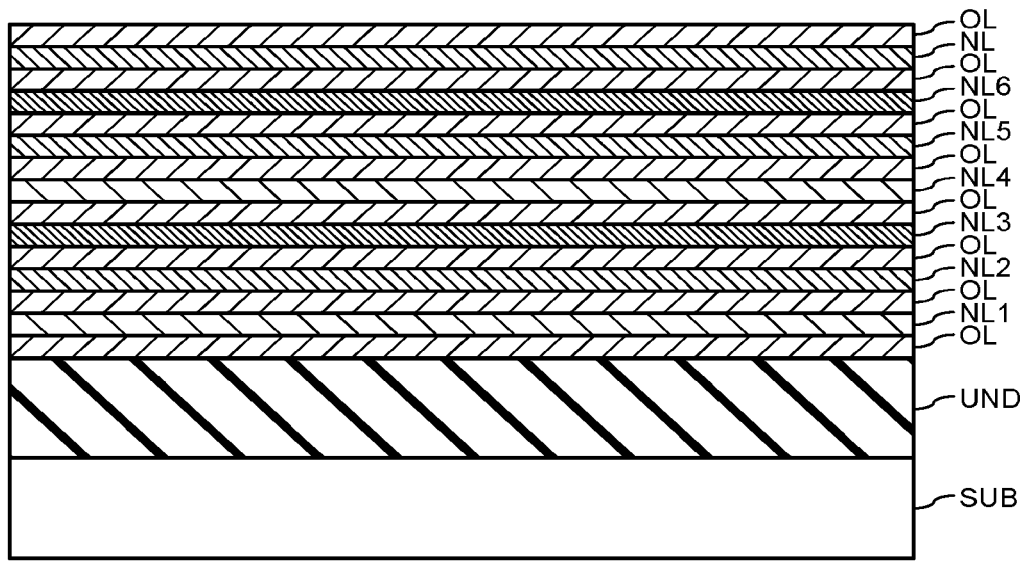
FIGS. 4A and 4B are views illustrating an example of a procedure of a method of manufacturing the semiconductor memory device according to the first embodiment.

As illustrated in FIG. 4A, a plurality of insulating layers OL and a plurality of insulating layers NL are alternately stacked on the substrate SUB such as a silicon substrate. The insulating layer NL is a sacrificial layer to be replaced with a conductive material such as tungsten and serves as the word line WL and the select gate line SGD in a subsequent processing, and is, for example, a SiN layer or the like.

Note that as the insulating layers NL1 to NL6 serving as the word lines WL, layers having different etching rates with respect to a wet etching solution to be described below are formed by changing at least one of a composition and a density. Among the insulating layers NL1 to NL6, for example, the insulating layers NL1 and NL4 are configured to have the fastest etching rate. Among the insulating layers NL1 to NL6, for example, the insulating layers NL3 and NL6 are configured to have the slowest etching rate. For example, the insulating layers NL2 and NL5 are configured to have an intermediate etching rate of the insulating layers NL1 and NL4 and the insulating layers NL3 and NL6.

Such insulating layers NL1 to NL6 can be formed by adjusting at least one of a temperature and pressure of the substrate SUB at the time of film formation, the type and flow rate of the film-forming gas, and a concentration of impurities mixed in the insulating layers NL1 to NL6, for example, by a plasma chemical vapor deposition (P-CVD) method or the like.

Figure 4B:
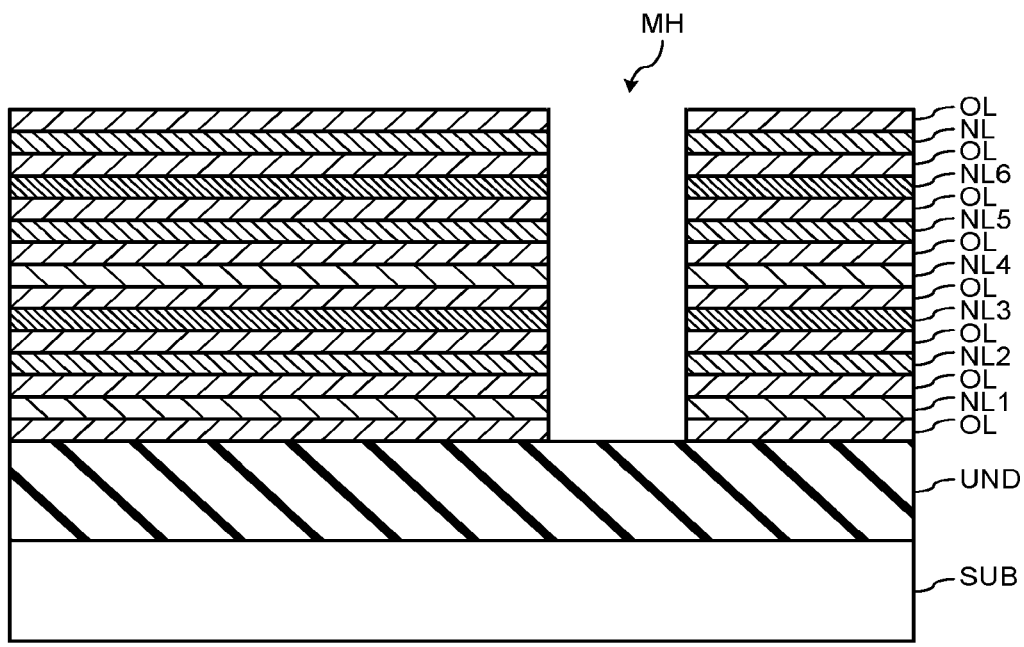

As illustrated in FIG. 4B, a plurality of memory holes MH penetrating the plurality of insulating layers OL and NL including the division layer MT and reaching the substrate SUB are formed in a region serving as the cell array region CA (see FIG. 3A).

Figure 5A:
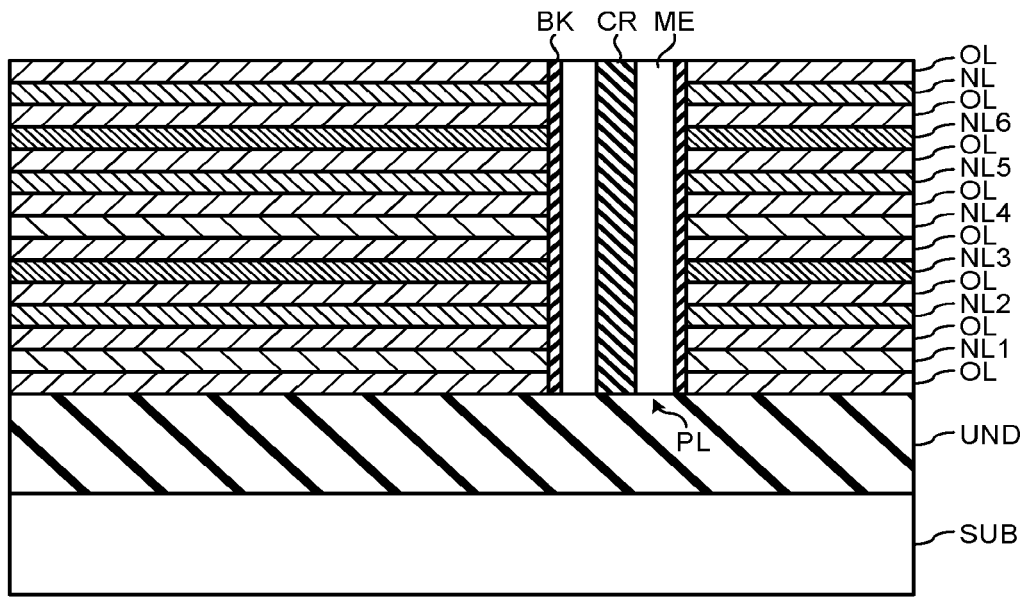
FIGS. 5A and 5B are views illustrating an example of a procedure of a method of manufacturing the semiconductor memory device according to the first embodiment.
Figure 5B:
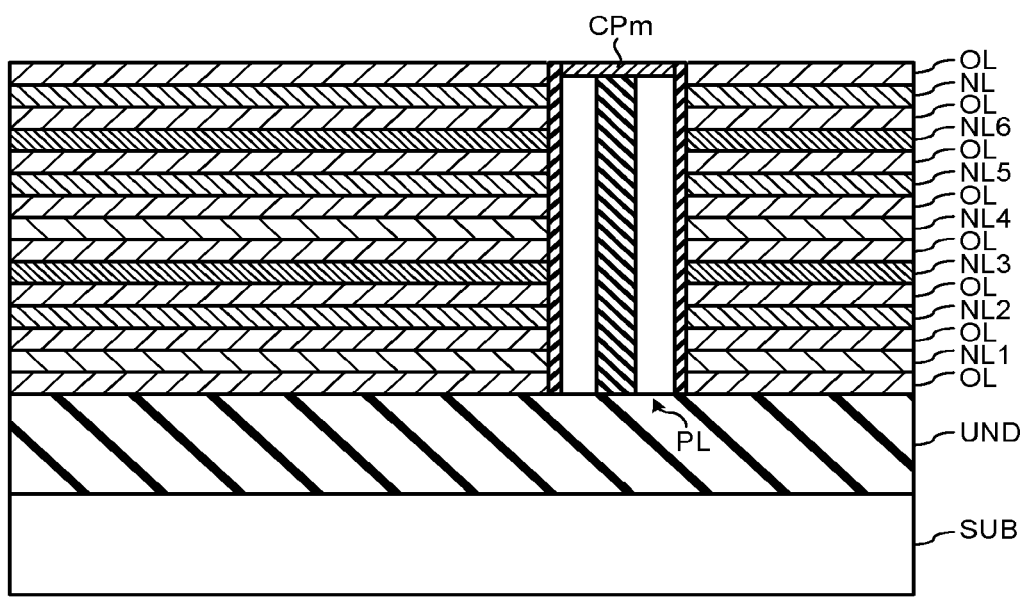

As illustrated in FIGS. 5A and 5B, the insulating layer BK and the oxide semiconductor layer ME are formed in each of the memory holes MH in order from an inner wall of the memory hole MH. The plurality of pillars PL are formed by filling a gap inside the oxide semiconductor layer ME with the core layer CR.

As illustrated in FIG. 5B, the cap layer CPm is formed at an upper end portion of the pillar PL. Thereafter, an insulating layer (not illustrated) formed of, for example, the same material as that of the insulating layer OL is formed to cover the entire pillars PL and the entire cap CPm.

In addition, the contact plugs CC1 to CC3 are formed as follows.

Figure 6A:
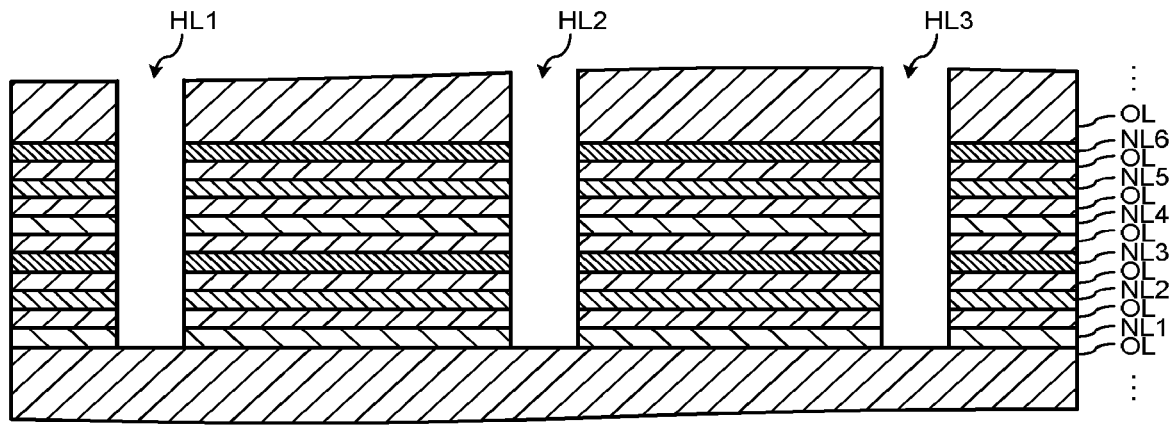
FIGS. 6A to 6C are views illustrating an example of a procedure of a method of manufacturing the semiconductor memory device according to the first embodiment.

As illustrated in FIG. 6A, a plurality of contact holes HL1 to HL3 penetrating the insulating layers NL1 to NL6 serving as the word lines WL and the insulating layer OL therebetween are formed outside the region serving as the cell array region CA by a reactive ion etching (RIE) method or the like. The contact holes HL1 to HL3 are formed to have substantially the same diameters as those of the contact plugs CC1 to CC3 to be formed later.

Figure 6B:
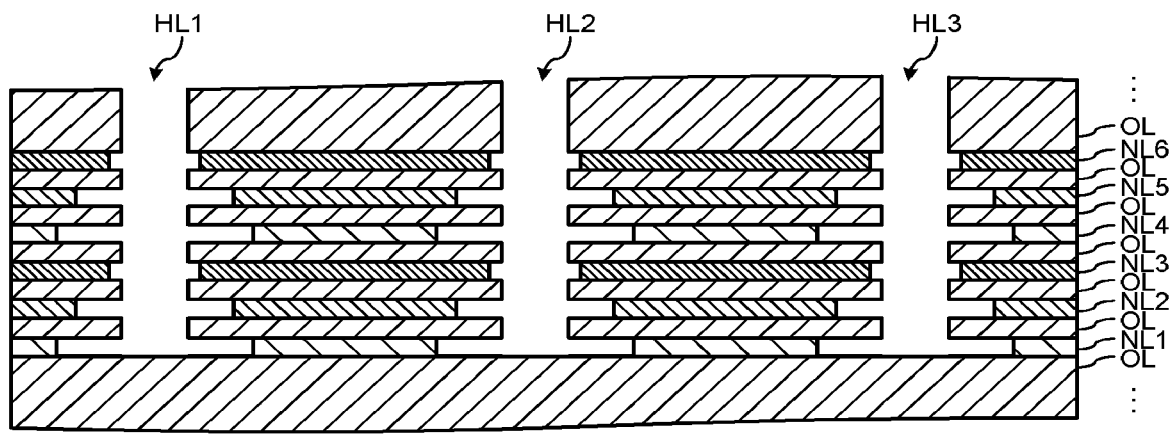

As illustrated in FIG. 6B, the substrate SUB is immersed in, for example, a wet etching solution such as hot phosphoric acid, and the insulating layers NL1 to NL6 are retreated from portions exposed to inner walls of the contact holes HL1 to HL3 by a predetermined distance. Since the insulating layers NL1 to NL6 are isotropically etched and removed in a circumferential direction of each of the contact holes HL1 to HL3, the insulating layers NL1 to NL6 are retreated in a circular shape in the top view.

In this case, since etching rates of the insulating layers NL1 to NL6 are different from each other, retreat distances of the insulating layers NL1 to NLG from the exposed portions are also different from each other. The insulating layers NL3 and WL6 having the lowest etching rates are retreated from the central axes of the contact holes HL1 to HL3 by, for example, the distance D1. The insulating layers NL1 and WL4 having the highest etching rates are retreated from the central axes of the contact holes HL1 to HL3 by, for example, the distance D3. The insulating layers NL2 and NL5 having the intermediate etching rates are retreated from the central axes of the contact holes HL1 to HL3 by, for example, the distance D2.

Figure 6C:
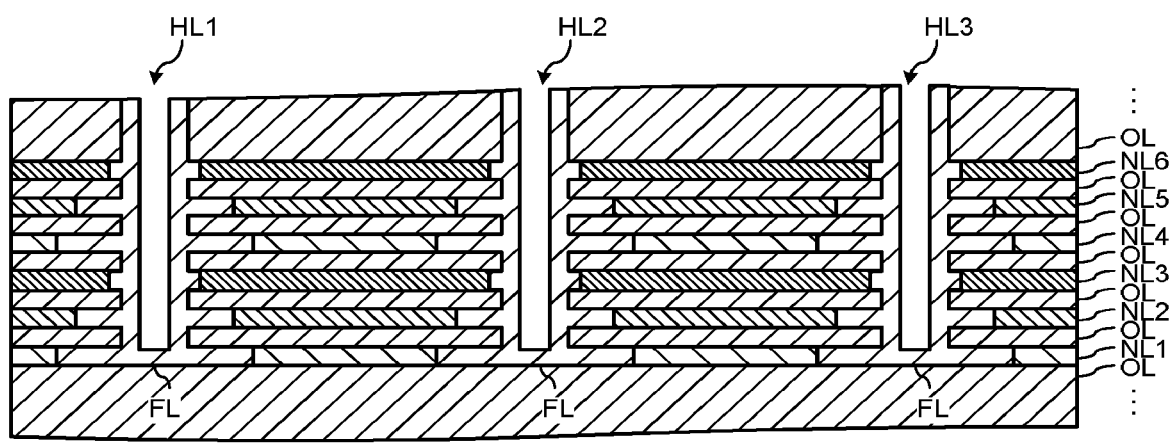

As illustrated in FIG. 6C, the insulating layer FL covering the inner walls and bottom surfaces of the contact holes HL1 to HL3 is formed by a CVD method or the like, The insulating layer FL is preferably formed as a layer that is more easily etched and removed than, for example, the insulating layer OL, that is, a layer having a high etching rate. In addition, in this case, the insulating layer FL is formed so that a thickness of the insulating layer FL is equal to or more than half of a thickness of each of the insulating layers NL1 to NL6. Therefore, gaps generated by the retreat of the insulating layers NL1 to NL6 from the inner walls of the contact holes HL1 to HL3 can he filled with the insulating layer FL. However, a thickness of the insulating layer FL is adjusted so that the contact holes HL1 to HL3 are not completely filled with the insulating layer FL.

Figure 7A:
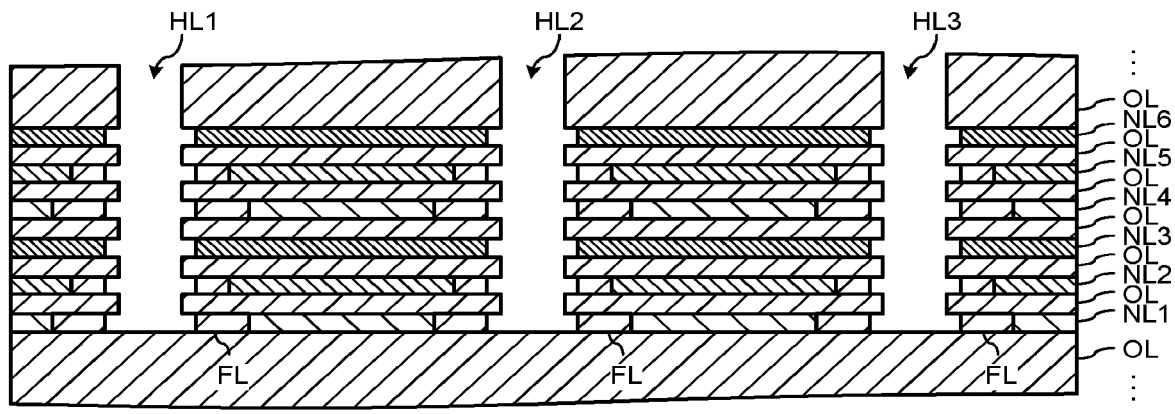
FIGS. 7A to 7C are views illustrating an example of a procedure of a method of manufacturing the semiconductor memory device according to the first embodiment.

As illustrated in FIG. 7A, the substrate SUB is immersed in a wet etching solution such as an aqueous hydrofluoric acid solution, and the insulating layers FL formed in the contact holes HL1 to HL3 are removed by etching. Therefore, the end portions of the insulating layers NL3 and NL6 are exposed in the contact holes HL1 to HL3.

In this case, a wet etching time or the like is adjusted so that the other insulating layers NL1, NL2, NL4, and NL5 are not exposed. Therefore, at the height positions of the insulating layers NL1, NL2, NL4, and NL5, a retreat amount of the insulating layer FL from each of the inner walls of the contact holes HL1 to HL3 is substantially equal to a retreat amount of each of the insulating layers NL3 and NL6, that is, the distance D1.

Figure 7B:
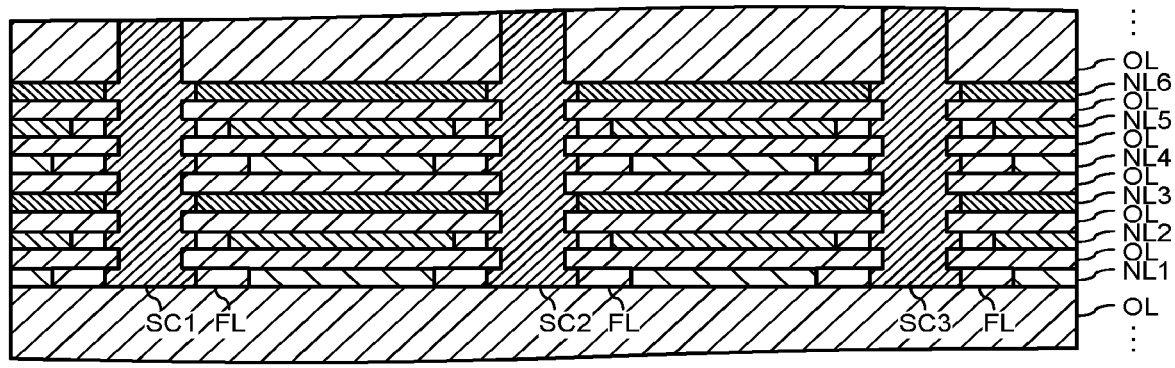

As illustrated in FIG. 7B, the contact holes HL1 to HL3 are filled with sacrificial layers SC1 to SC3 such as a silicon layer, respectively, by a CVD method or the like.

In addition, the sacrificial layer SC1 is covered with a mask pattern (not illustrated) such as a $SiO_2$ layer. Such a mask pattern is obtained by forming a mask layer covering the entire sacrificial layers SC1 to SC3, forming a resist pattern covering a region on the sacrificial layer SC1 by a photolithography method or the like, and wet-etching the mask layer with an aqueous hydrofluoric acid solution or the like using the resist pattern as a mask. After the formation of the mask pattern, the resist pattern is removed by a process with a mixed solution of sulfuric acid and hydrogen peroxide, an aching process with oxygen plasma, or the like.

Figure 7C:
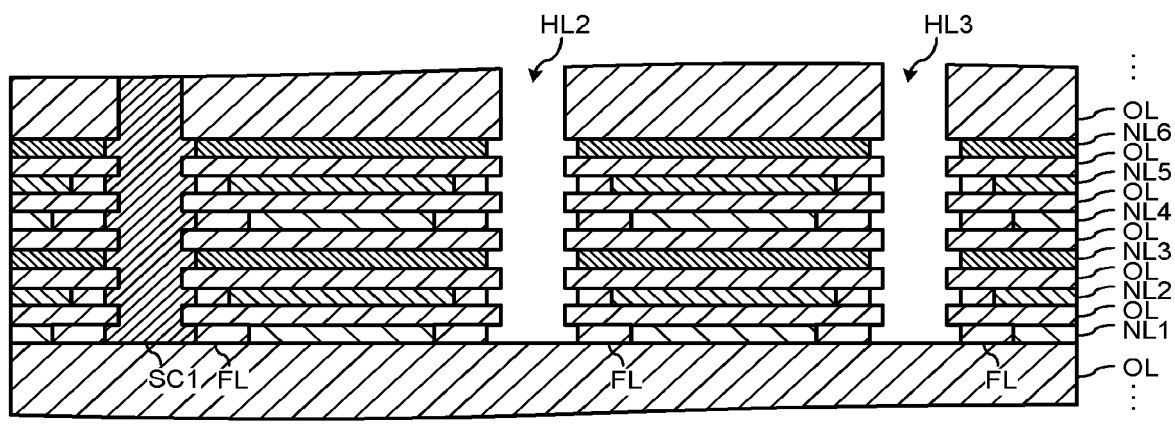

As illustrated in FIG. 7C, the substrate SUB is immersed in an aqueous alkaline solution to remove the sacrificial layers SC2 and SC3 not covered with the mask pattern, thereby opening the contact holes HL2 and HL3.

Figure 8A:
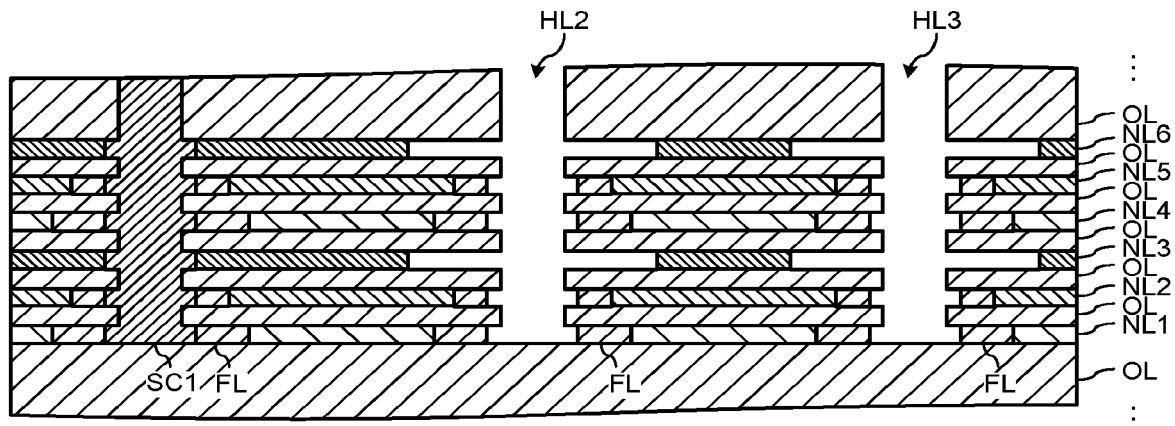
FIGS. 8A to 8C are views illustrating an example of a procedure of a method of manufacturing the semiconductor memory device according to the first embodiment.

As illustrated in FIG. 8A, the substrate SUB is immersed in, for example, a wet etching solution such as hot phosphoric acid, and the insulating layers NL3 and NL6 are retreated from portions exposed to the inner walls of the contact holes HL2 and HL3 by a predetermined distance. The insulating layers NL3 and WL6 are retreated from the central axes of the contact holes HL2 and HL3 by, for example, the distance D4.

Figure 8B:
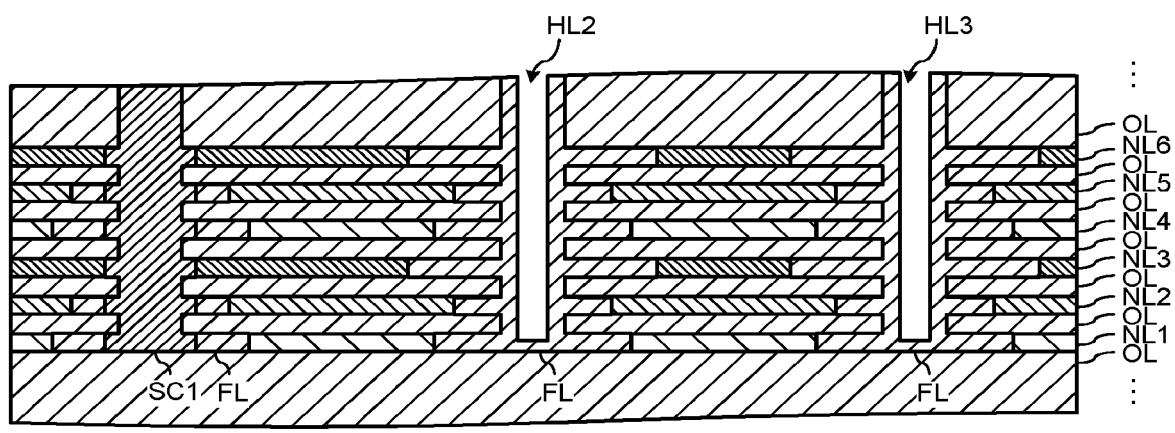

As illustrated in FIG. 8B, the insulating layer FL covering the inner walls and bottom surfaces of the contact holes HL2 and HL3 is formed by a CVD method or the like. In this case, the insulating layer FL is formed so as to fill the gaps generated by the retreat of the insulating layers NL3 and NL6 from the inner walls of the contact holes HL2 and HL3 and not to completely fill the contact holes HL2 and HL3 themselves.

Figure 8C:
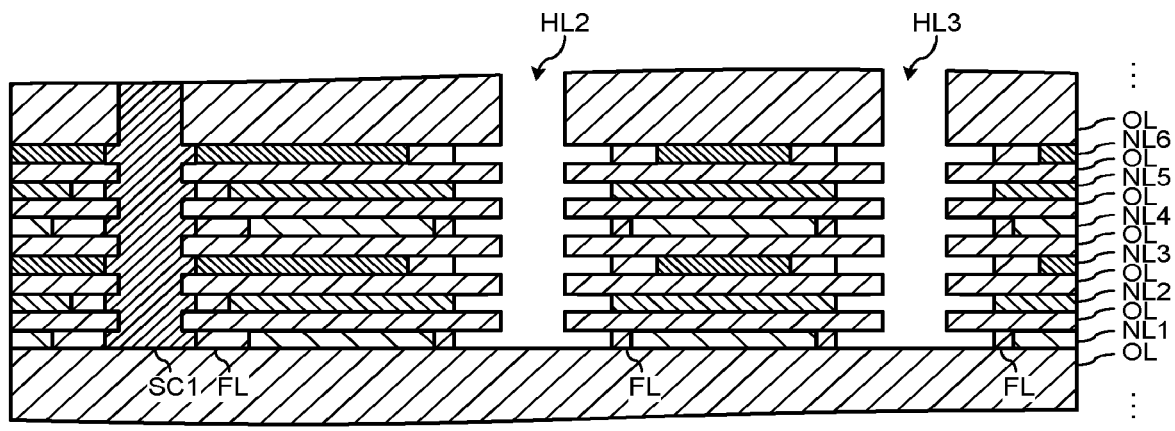

As illustrated in FIG. 8C, the substrate SUB is immersed in, for example, a wet etching solution such as an aqueous hydrofluoric acid solution, the insulating layers FL formed in the contact holes HL2 and HL3 are removed by etching, and the end portions of the insulating layers NL2 and NL5 are exposed in the contact holes HL2 and HL3. In this case, at the height positions of the insulating layers NL1, NL3, NL4, and NL6, a retreat amount of the insulating layer FL from each of the inner walls of the contact holes HL2 and HL3 is substantially equal to a retreat amount of each of the insulating layers NL2 and NL5, that is, the distance D2.

Figure 9A:
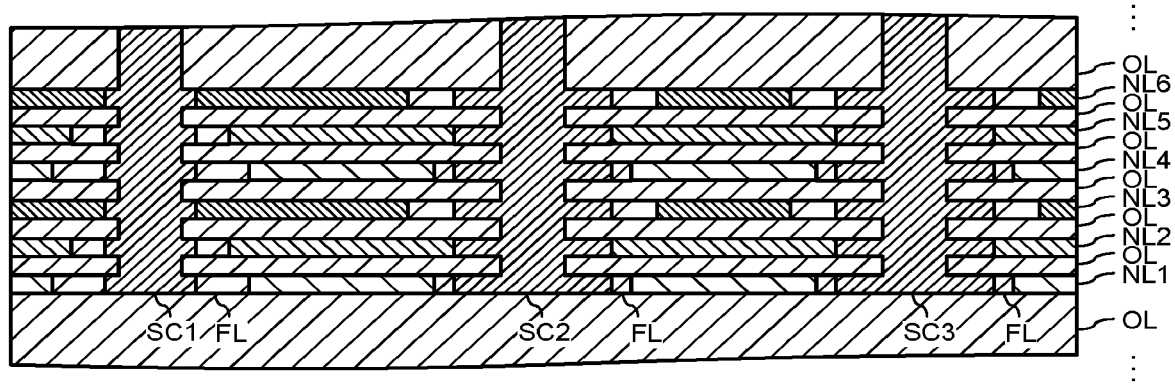
FIGS. 9A to 9C are views illustrating an example of a procedure of a method of manufacturing the semiconductor memory device according to the first embodiment.

As illustrated in FIG. 9A, the contact holes HL2 and HL3 are filled with sacrificial layers SC2 and SC3 such as a silicon layer, respectively, by a CVD method or the like.

In addition, the sacrificial layers SC1 and SC2 are covered with a mask pattern (not illustrated) such as a $SiO_2$ layer.

Figure 9B:
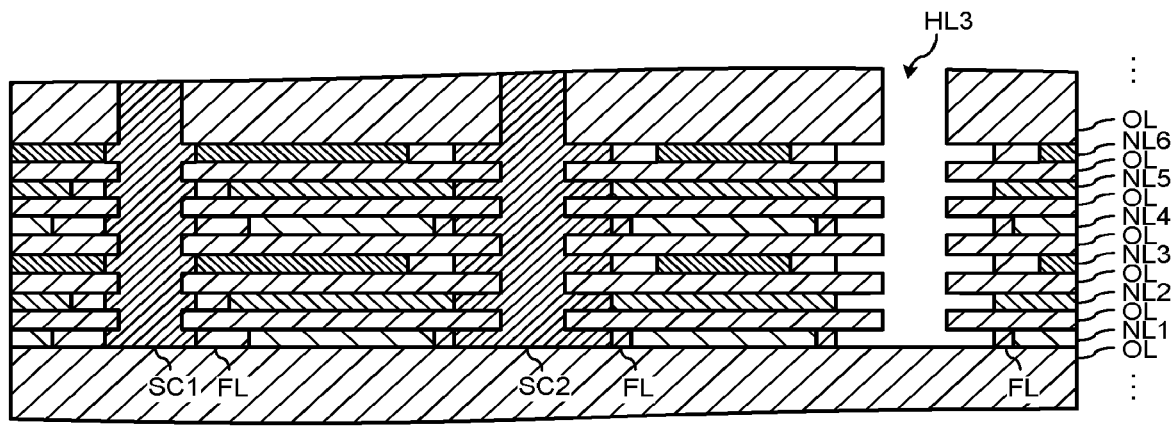

As illustrated in FIG. 9B, the substrate SUB is immersed in an aqueous alkaline solution to remove the sacrificial layer SC3 not covered with the mask pattern, thereby opening the contact hole HL3.

Figure 9C:
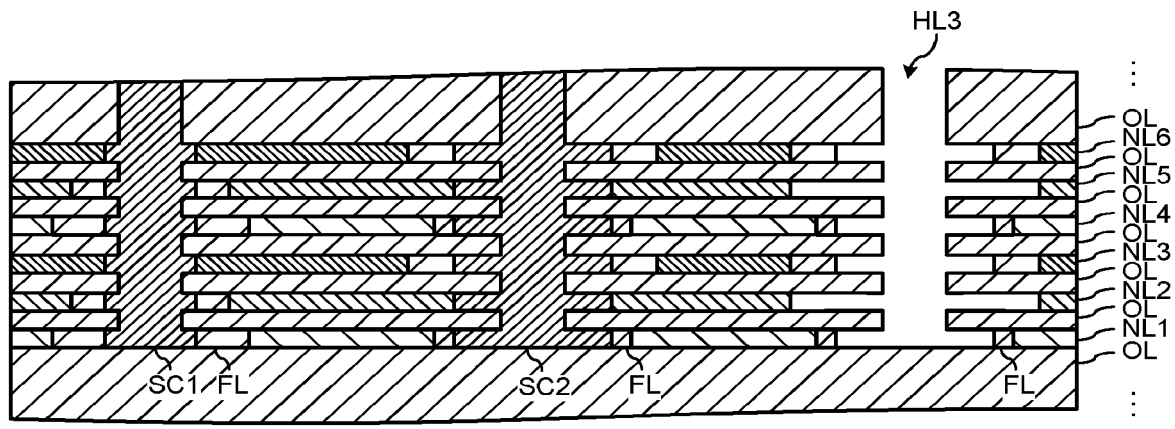

As illustrated in FIG. 9C, the substrate SUB is immersed in, for example, a wet etching solution such as hot phosphoric acid, and the insulating layers NL2 and NL5 are retreated from a portion exposed to the inner wall of the contact hole HL3 by a predetermined distance. The insulating layers NL2 and WL5 are retreated from the central axis of the contact hole HL3 by, for example, the distance D4.

Figure 10A:
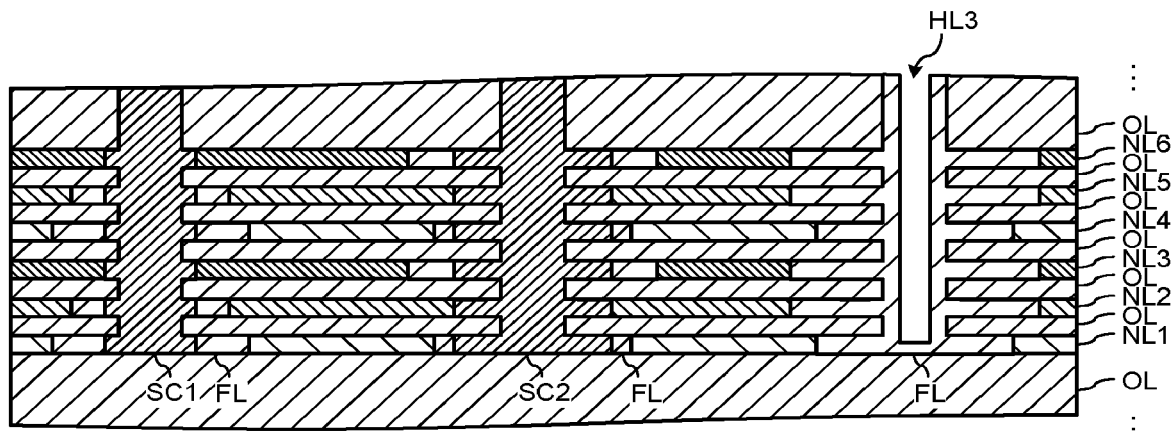
FIGS. 10A to 10C are views illustrating an example of a procedure of a method of manufacturing the semiconductor memory device according to the first embodiment.

As illustrated in FIG. 10A, the insulating layer FL covering the inner wall and bottom surface of the contact hole HL3 is formed by a CVD method or the like. In this case, the insulating layer FL is formed so as to fill the gap generated by the retreat of the insulating layers NL2 and NL5 from the inner wall of the contact hole HL3 and not to completely fill the contact hole HL3 itself.

Figure 10B:
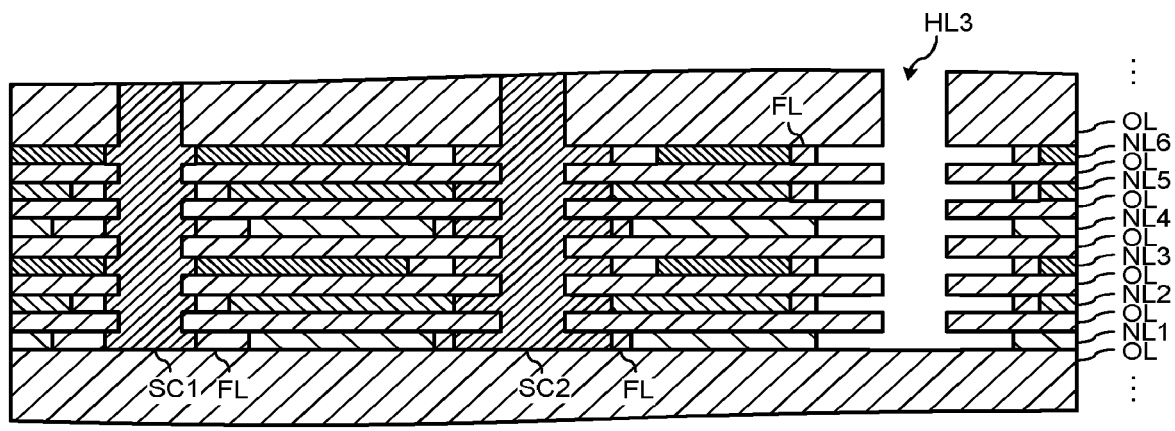

As illustrated in FIG. 10B, the substrate SUB is immersed in, for example, a wet etching solution such as an aqueous hydrofluoric acid solution, the insulating layer FL formed in the contact hole HL3 is removed by etching, and the end portions of the insulating layers NL1 and NL4 are exposed in the contact hole HL3. In this case, at the height positions of the insulating layers NL2, NL3, NL5, and NL6, a retreat amount of the insulating layer FL from the inner wall of the contact hole HL3 is substantially equal to a retreat amount of each of the insulating layers NL1 and NL4, that is, the distance D3.

Figure 10C:
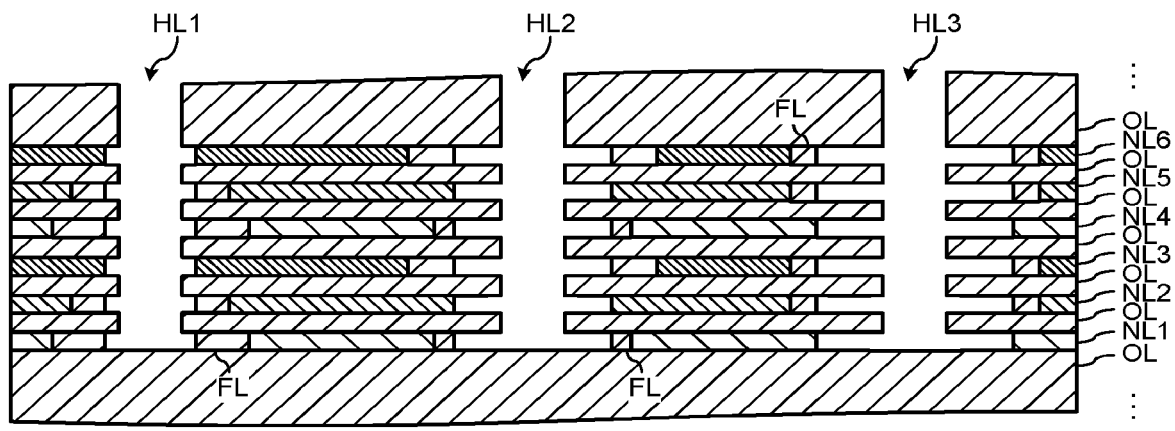

As illustrated in FIG. 10C, the substrate SUB is immersed in an aqueous alkaline solution to remove the sacrificial layers SC1 and SC2, thereby opening the contact holes HL1 and HL2.

Figure 11A:
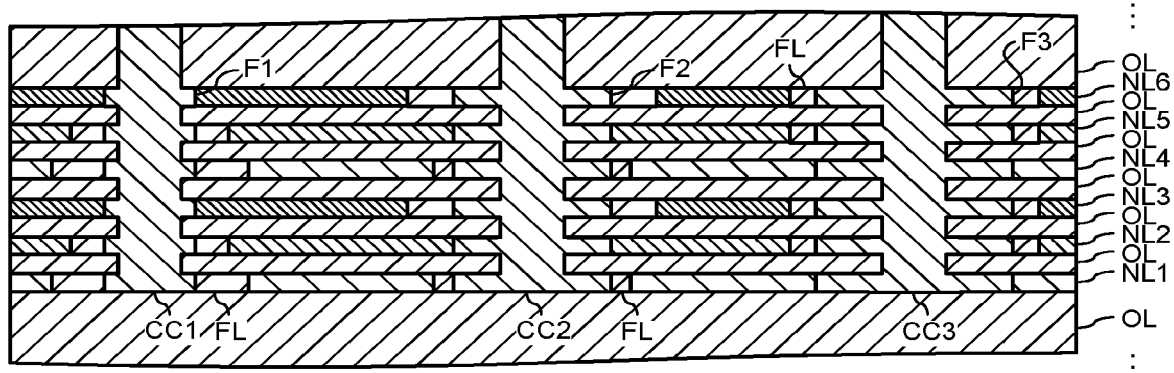
FIGS. 11A to 11C are views illustrating an example of a procedure of a method of manufacturing the semiconductor memory device according to the first embodiment.

As illustrated in FIG. 11A, the contact holes HL1 to HL3 are filled with a conductive material such as tungsten. In this case, in the contact holes HL1 to HL3, the gaps at the height positions of the insulating layers NL1 to NL6 are also filled with the conductive material. The contact hole HL1 has a gap distant from the central axis of the contact hole HL1 by the distance D1. Accordingly, the contact plug CC1 having the flange F1 is formed. The contact hole HL2 has a gap distant from the central axis of the contact hole HL2 by the distance D2. Accordingly, the contact plug CC2 having the flange F2 is formed. The contact hole HL3 has a gap distant from the central axis of the contact hole HL3 by the distance D3. Accordingly, the contact plug CC3 having the flange F3 is formed.

A groove-like slit ST (see FIG. 1 and FIG. 3A) extending in the X direction, penetrating from the uppermost layer to the lowermost layer of the stacked structure including the insulating layers NL1 to NL6, and reaching the substrate SUB is formed. At this time, the slit ST is not filled with anything.

Figure 11B:
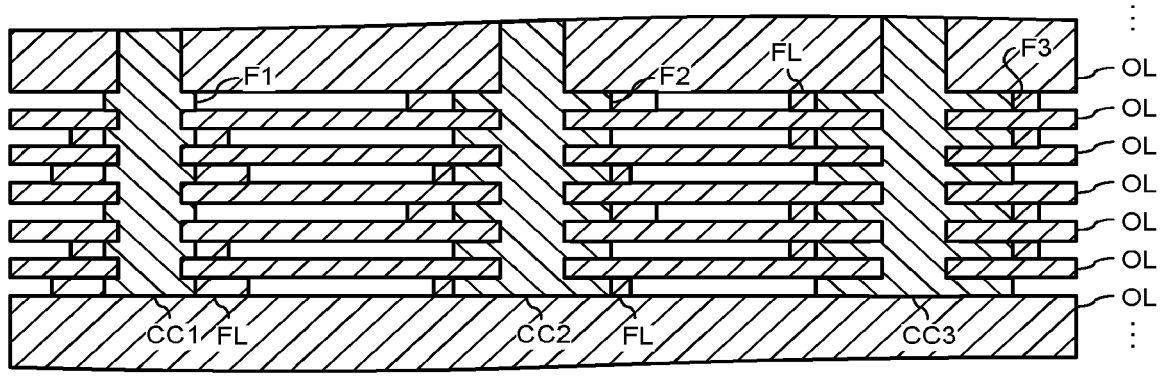

As illustrated in FIG. 11B, the insulating layers NL1 to NL6 between the insulating layers OL are removed by the slit ST. Therefore, gaps are generated between the insulating layers OL.

Figure 11C:
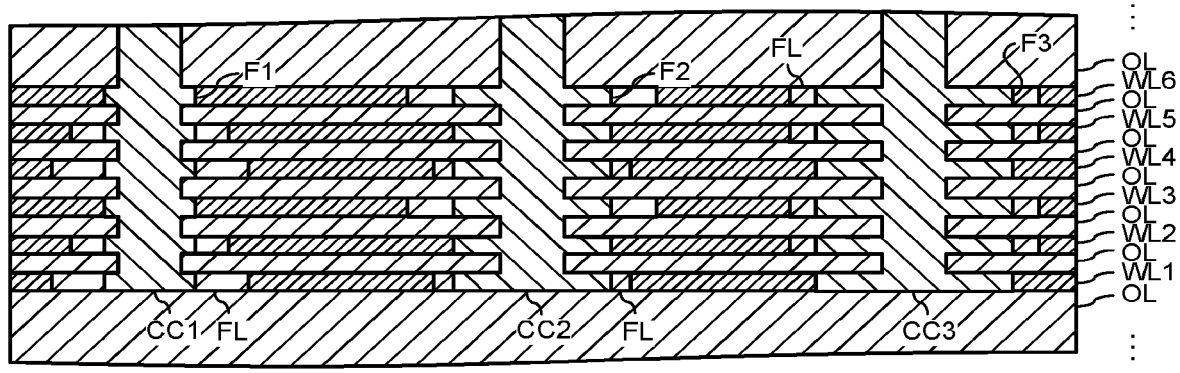

As illustrated in FIG. 11C, the gaps generated between the insulating layers OL by the slit ST are filled with a conductive material such as tungsten. Therefore, the word lines WL are formed between the insulating layers OL. As such, the processing of removing the insulating layers NL and replacing the insulating layers NL with the conductive material is also referred to as replacement processing.

The replacement processing is also performed in the cell array region CA.

Figure 12A:
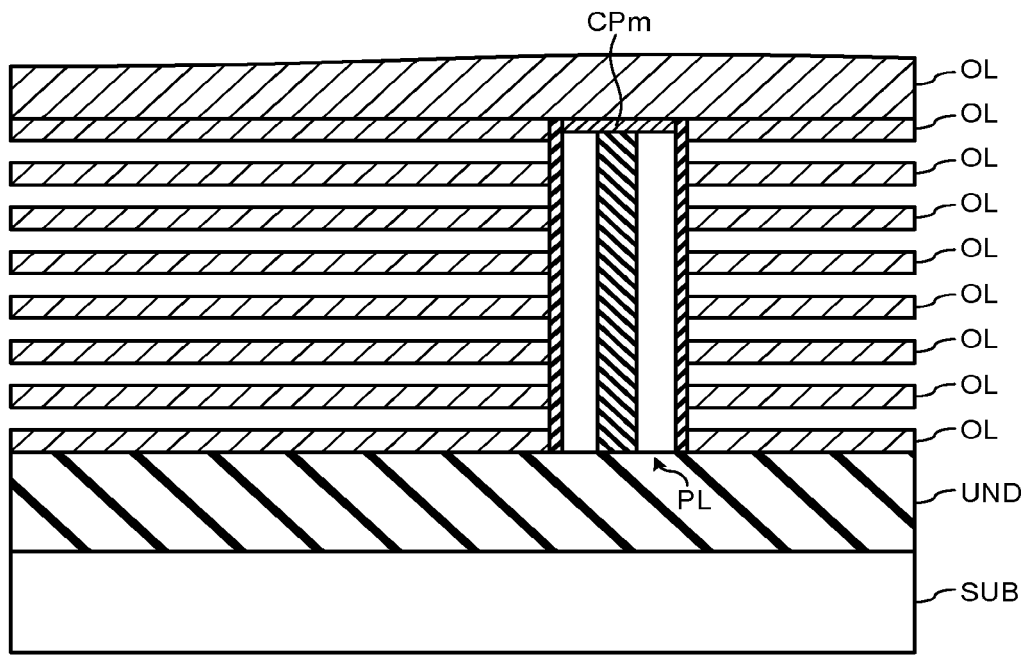
FIGS. 12A and 12B are views illustrating an example of a procedure of a method of manufacturing the semiconductor memory device according to the first embodiment.

As illustrated in FIG. 12A, the insulating layers NL between the insulating layers OL are removed to generate gaps between the insulating layers OL.

Figure 12B:
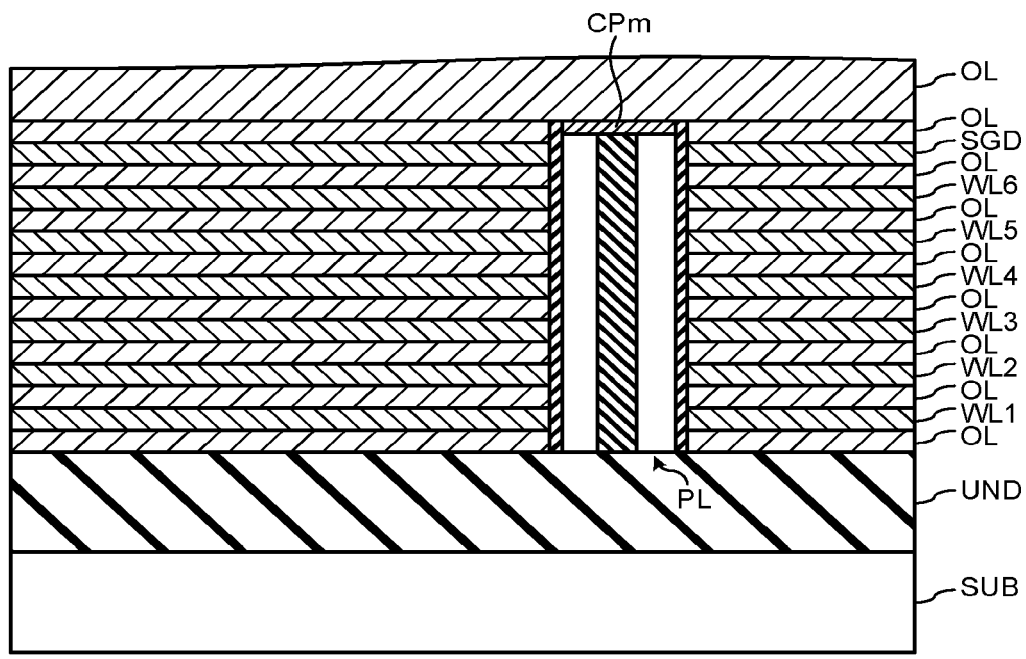

As illustrated in FIG. 12B, the gaps generated between the insulating layers OL are filled with a conductive material such as tungsten. Accordingly, the word lines WL and the select gate line SGD are formed between the insulating layers OL. Thereafter, the readout circuit units RCU are sequentially formed from above.

As described above, the manufacturing of the semiconductor memory device 1 of the first embodiment is completed.

COMPARATIVE EXAMPLE

In a semiconductor memory device of a comparative example, for the contact between the plurality of stacked word lines, a stair structure in which the end portions of the word lines terminate in a stair shape is formed outside the cell array region. By forming the stair structure so that each of the word lines constitutes each step, a contact plug can be arranged at each step of the stair structure and can be connected to the word line.

However, an area occupied by such a stair structure increases as the number of layers of the word lines increases, and compresses the cell array region. In addition, in order to form a stair structure in which the word lines are arranged one by one, a complicated manufacturing method needs to be performed, which increases throughput and cost.

In addition, in the semiconductor memory device of the comparative example, individual word lines are connected to word line drivers individually provided. The word line driver includes, for example, a transistor arranged on a substrate such as a semiconductor substrate, and an area occupied by such a word line driver also compresses the cell array region.

According to the semiconductor memory device 1 of the first embodiment, a shift register type writing operation and reading operation for transferring data of the memory cells MC arranged in series with respect to the substrate SUB by an electric field of the word line WL is adopted. Therefore, it is possible to perform the operation by bundle of the plurality of word lines WL into three sets, that is, the (3n+1)th, (3n+2)th, and (3n+3)th word lines WL, instead of individually applying a voltage to each of the word lines WL. In addition, it is not necessary to separately provide the word line driver for each word line WL, and the area occupied by the word line driver can be reduced.

According to the semiconductor memory device 1 of the first embodiment, since the shift register type operation is adopted, the plurality of word lines WL can be bundled into three sets using the three contact plugs CC1 to CC3. The (3n+3)th word line WL is bundled to the contact plug CC1, the (3n+2)th word line is bundled to the contact plug CC2, and the (3n+1)th word line WL is bundled to the contact plug CC3. Therefore, the stair structure can be eliminated, and a lead-out region of the word line WL can be reduced by the contact plugs CC1 to CC3. Accordingly, for example, the cell array region can be expanded or the semiconductor memory device 1 can be reduced. In addition, contact with the word lines WL can be realized by a relatively simple process of forming the contact plugs CC1 to CC3.

According to the semiconductor memory device 1 of the first embodiment, the contact plugs CC1 to CC3 have substantially equal diameters, for example, and the word lines WL to be connected are selected depending on the diameters of the flanges F1 to F3. Therefore, the contact resistances between the contact plugs CC1 to CC3 can be substantially equalized.

Note that in the first embodiment described above, the word lines WL are bundled into three sets, but the present invention is not limited thereto. The word lines may be bundled into two sets or four or more sets. In this case, the type of the insulating layer having periodicity of the etching rate with respect to the stacking direction may be changed according to the number of sets of the word lines. For example, when the word lines are bundled into four sets, the number of types of the insulating layers may be four. In this case, the four contact plugs are connected to the (4n+1)th, (4n+2)th, (4n+3)th, and (4n+4)th word lines counted from the substrate SUS side, respectively.

First Modification

Figure 13A:
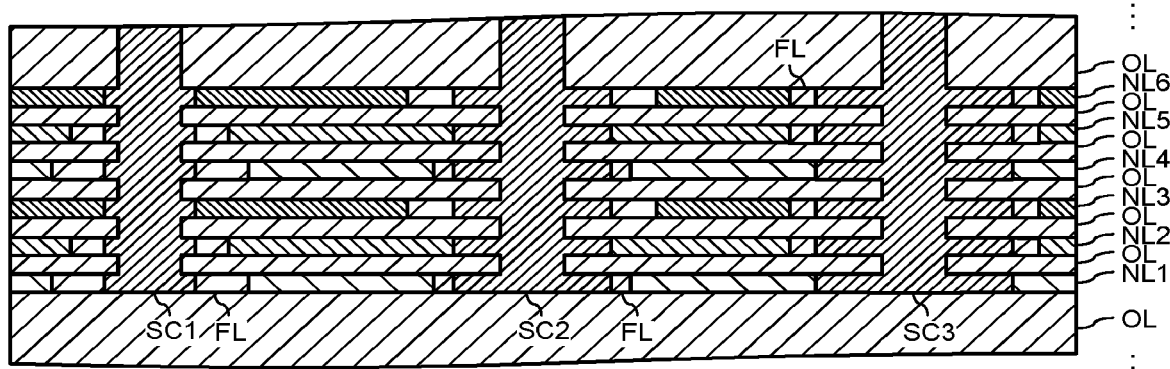
FIGS. 13A to 13C are views illustrating an example of a procedure of a method of manufacturing a semiconductor memory device according to a first modification of the first embodiment.
Figure 13B:
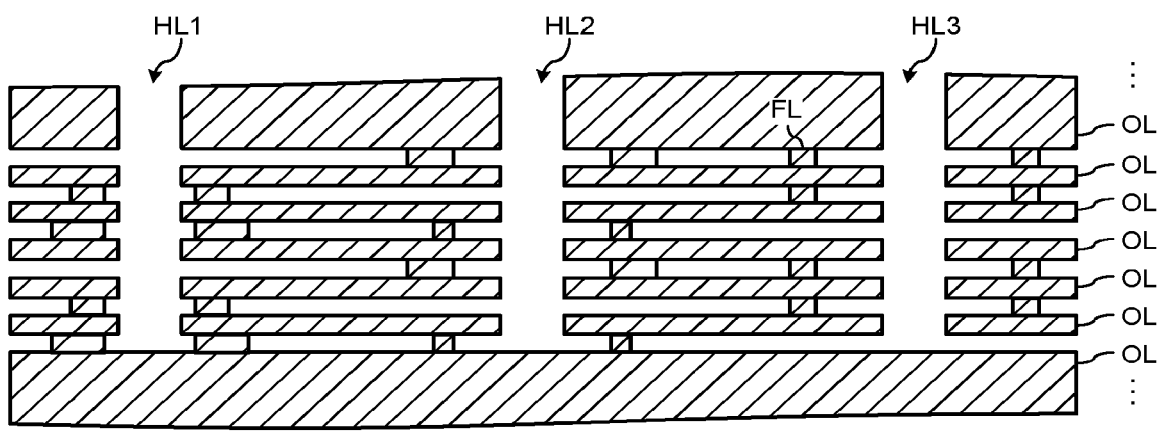
Figure 13C:
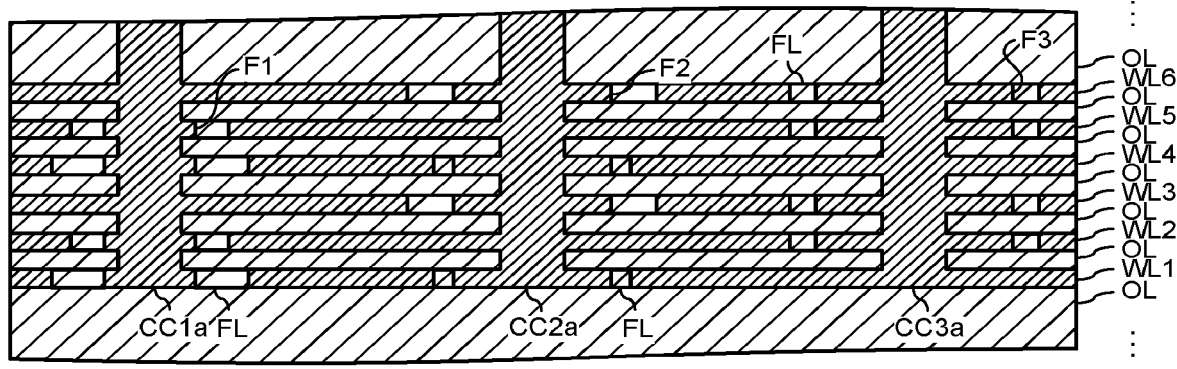

Next, a semiconductor memory device of a first modification of the first embodiment will be described with reference to FIGS. 13A to 13C. FIGS. 13A to 13C are views illustrating an example of a procedure of a method of manufacturing the semiconductor memory device according to the first modification of the first embodiment. The semiconductor memory device of the first modification is different from the first embodiment in a replacement method.

As illustrated in FIG. 13A, after the processing of FIG. 10B of the first embodiment, the sacrificial layers SC1 and SC2 are not removed, but the contact hole HL3 is filled with the sacrificial layer SC3. In addition, a groove-like slit ST penetrating from the uppermost layer to the lowermost layer of the stacked structure including the insulating layers NL1 to NL6 and reaching the substrate SUB is formed.

As illustrated in FIG. 13B, the insulating layers NL1 to NL6 between the insulating layers OL are removed by the slit ST. Therefore, gaps are generated between the insulating layers OL. In addition, the sacrificial layers SC1 to SC3 are also removed via the slit ST. Therefore, the contact holes HL1 to HL3 are opened.

As illustrated in FIG. 13C, the gaps generated between the insulating layers OL by the slit ST and the contact holes HL1 to HL3 are filled with a conductive material such as tungsten. Therefore, the word lines WL are formed between the insulating layers OL, and contact plugs CC1a to CC3a are formed in the contact holes HL1 to HL3, respectively.

According to the semiconductor memory device of the first modification, the sacrificial layers SC1 to SC3 of the contact holes HL1 to HL3 and the insulating layers NL1 to NL6 between the insulating layers OL are collectively replaced with a conductive material such as tungsten. Therefore, for example, a manufacturing cost can be further reduced as compared to the example of the first embodiment.

Note that in the first embodiment, the readout circuit unit RCU is separately formed after the replacement of the word lines WL or the like, but the present invention is not limited thereto. One or more gate lines (gate electrode wirings) among the control gate lines CG and the like constituting the readout circuit unit RCU may also be constituted by a sacrificial layer, and may be subjected to the replacement processing together with the contact plugs CC1a to CC3a and the word lines WL.

Second Modification

Next, a semiconductor memory device of a second modification of the first embodiment will be described with reference to FIG. 14. FIG. 14 is a view schematically illustrating an example of a configuration of contact plugs included in the semiconductor memory device according to the second modification of the first embodiment. The semiconductor memory device of the second modification is different from the first embodiment in the arrangement of the contact plugs CC1b to CCc.

As illustrated in FIG. 14, the semiconductor memory device of the second modification includes contact plugs CC1b to CC3b arranged in a cell array region CAb. As described above, unlike the stair structure, the contact plugs CC1b to CC3b can be arranged in the cell array region CAb.

In addition, a plurality of sets of the contact plugs CC1b to CC3b may be arranged at desired locations in the cell array region CAb.

In addition, after the contact plugs CC1 to CC3 of the first embodiment are arranged outside the cell array region, the contact plugs CC1b to CC3b may be arranged inside the cell array region.

According to the semiconductor memory device of the second modification, the contact plugs CC1b to CC3b are arranged in the cell array region CAb. As described above, in a case where the contact plugs CC1b to CC3b are arranged in the cell array region CAb, the resistance of the word line WL may be suppressed, and the area use efficiency in the semiconductor memory device may be excellent.

According to the semiconductor memory device of the second modification, the plurality of sets of the contact plugs CC1b to CC3b are arranged at a plurality of locations in the cell array region CAb. Therefore, the resistance between the word lines WL and the contact plugs CC1b to CC3b can be reduced.

According to the semiconductor memory device of the second modification, since the contact plugs CC1 to CC3 and CC1b to CC3b can be arranged in various combinations, a degree of freedom in designing the semiconductor memory device increases.

Second Embodiment

Next, a semiconductor memory device 2 of a second embodiment will be described with reference to FIGS. 15A to 28C. The semiconductor memory device 2 of the second embodiment is different from the first embodiment in the configuration of the contact Plugs.

(Configuration Example of Contact Plug)

Figure 15A:
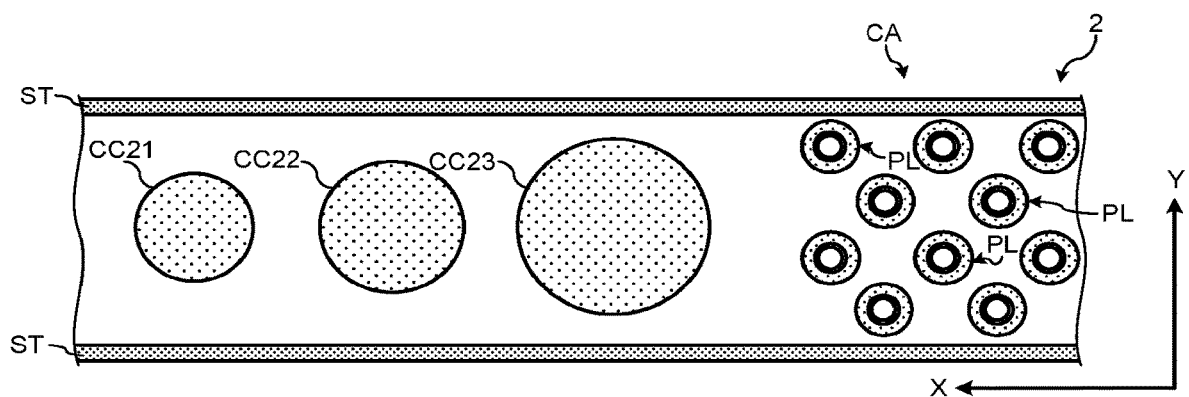
FIGS. 15A and 15B are views schematically illustrating an example of a configuration of contact plugs included in a semiconductor memory device according to a second embodiment.
Figure 15B:
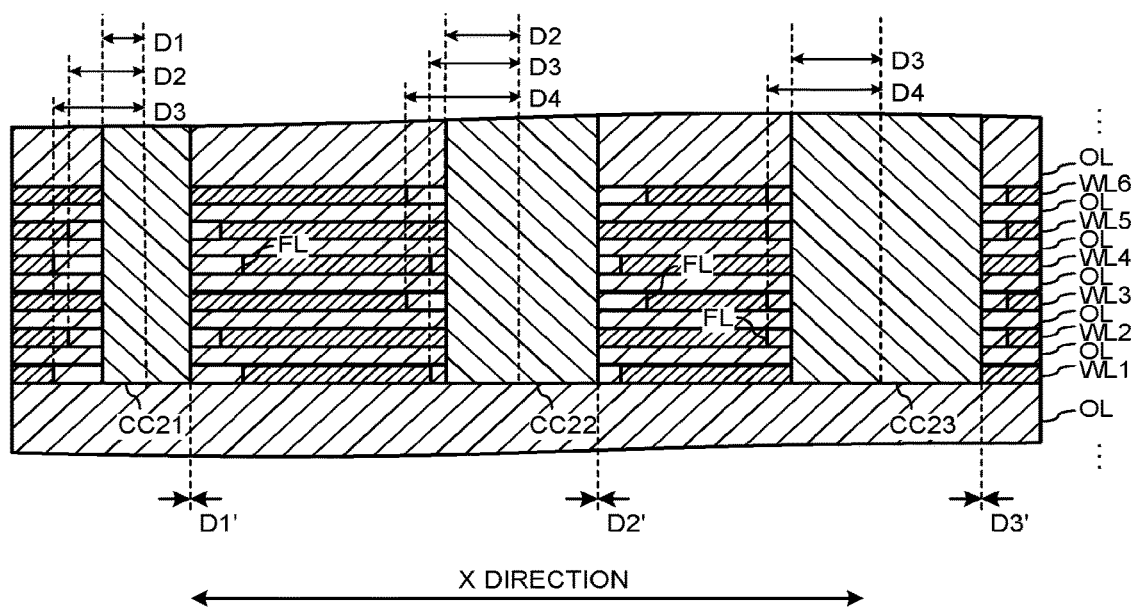

The configuration of the contact plugs that bundle the word lines WL into a plurality of sets is not limited to the contact plugs CC1 to CC3 of the first embodiment. FIGS. 15A and 15B illustrate contact plugs CC21 to CC23 of another example.

FIGS. 15A and 15B are views schematically illustrating an example of the configuration of the contact plugs CC21 to CC23 included in the semiconductor memory device 2 according to the second embodiment. FIG. 15A is a cross-sectional view illustrating any one of word lines WL included in the semiconductor memory device 2, and FIG. 15B is a longitudinal sectional view of the contact plugs CC21 to CC23 in an X direction. Note that upper and lower configurations of the word line WL are omitted in FIG. 15B. In addition, in FIG. 15B, for convenience, a word line WL1, a word line WL2, a word line WL3, . . . , and the like are arranged in this order from the word line WL closest to the substrate SUB.

As illustrated in FIGS. 15A and 15B, the contact plugs CC21 to CC23 have different diameters. That is, the contact plugs CC21 to CC23 are connected to a predetermined word line WL by expanding the diameters of the contact plugs CC21 to CC23 themselves.

A radius of the contact plug CC21 is, for example, a distance D1. That is, a distance from the central axis of the contact plug CC21 to a side surface of the contact plug CC21 is the distance D1.

Therefore, the side surface of the contact plug CC21 reaches positions of end portions of the word lines WL3 and WL6 separated from the central axis of the contact plug CC21 by the distance D1. In other words, the side surface of the contact plug CC21 and the end portions of the word lines WL3 and WL6 are separated by a distance D1' (=0). Accordingly, the contact plug CC21 is connected to the word lines WL3 and WL6 on the side surface of the contact plug CC21.

The side surface of the contact plug CC21 does not reach positions of end portions of the word lines WL2 and WL5 separated from the central axis of the contact plug CC21 by a distance D2 and end portions of the word lines WL1 and WL4 separated from the central axis of the contact plug CC21 by a distance D3. In other words, the side surface of the contact plug CC21 and the end portions of the word lines WL2 and WL5 are separated by more than the distance D1' (=0). In addition, the side surface of the contact plug CC21 and the end portions of the word lines WL1 and WL4 are separated by more than the distance D1' (=0). Accordingly, the contact plug CC21 is not in contact with the word lines WL1, WL2, WL4, and WL5. A gap between the side surface of the contact plug CC21 and the word lines WL1, WL2, WL4, and WL5 is filled with an insulating layer FL.

A radius of the contact plug CC22 is, for example, a distance D2. That is, a distance from the central axis of the contact plug CC22 to a side surface of the contact plug CC22 is the distance D2.

Therefore, the side surface of the contact plug CC22 reaches the positions of the end portions of the word lines WL2 and WL5 separated from the central axis of the contact plug CC22 by the distance D2. In other words, the side surface of the contact plug CC22 and the end portions of the word lines WL2 and WL5 are separated by a distance D2' (=0). Accordingly, the contact plug CC22 is connected to the word lines WL2 and WL5 on the side surface of the contact plug CC22.

The side surface of the contact plug CC22 does not reach the positions of the end portions of the word lines WL1 and WL4 separated from the central axis of the contact plug CC22 by a distance D3 and the end portions of the word lines WL3 and WL6 separated from the central axis of the contact plug CC22 by a distance D4. In other words, the side surface of the contact plug CC22 and the end portions of the word lines WL1 and WL4 are separated by more than the distance D2' (=0). In addition, the side surface of the contact plug CC22 and the end portions of the word lines WL3 and WL6 are separated by more than the distance D2' (=0). Accordingly, the contact plug CC22 is not in contact with the word lines WL1, WL3, WL4, and WL6. A gap between the side surface of the contact plug CC22 and the word lines WL1, WL3, WL4, and WL6 is filled with an insulating layer FL.

A radius of the contact plug CC23 is, for example, a distance D3. That is, a distance from the central axis of the contact plug CC23 to a side surface of the contact plug CC23 is the distance D3.

Therefore, the side surface of the contact plug CC23 reaches the positions of the end portions of the word lines WL1 and WL4 separated from the central axis of the contact plug CC23 by the distance D3. In other words, the side surface of the contact plug CC23 and the end portions of the word lines WL1 and WL4 are separated by a distance D3' (=0). Accordingly, the contact plug CC23 is connected to the word lines WL1 and WL4 on the side surface of the contact plug CC23.

The side surface of the contact plug CC23 does not reach the positions of the end portions of the word lines WL2, WL3, WL5, and WL6 separated from the central axis of the contact plug CC23 by the distance D4. In other words, the side surface of the contact plug CC23 and the end portions of the word lines WL2, WL3, WL5, and WL6 are separated by more than the distance D3' (=0). Accordingly, the contact plug CC23 is not in contact with the word lines WL2, WL3, WL5, and WL6. A gap between the side surface of the contact plug CC23 and the word lines WL2, WL3, WL5, and WL6 is filled with an insulating layer FL.

As described above, when the hierarchical positions of the word lines WL are equal, that is, at the same height position of each of the contact plugs CC21 to CC23, the distance D1<D2<D3 is satisfied, the diameter of the contact plug CC22 is larger than that of the contact plug CC21, and the diameter of the contact plug CC23 is larger than that of the contact plug CC22.

(Example of Method of Manufacturing Semiconductor Memory Device)

Next, an example of a method of manufacturing the semiconductor memory device 2 will be described with reference to FIGS. 16A to 21C. FIGS. 16A to 21C are views each illustrating an example of a procedure of the method of manufacturing the semiconductor memory device 2 according to the second embodiment.

Figure 16A:
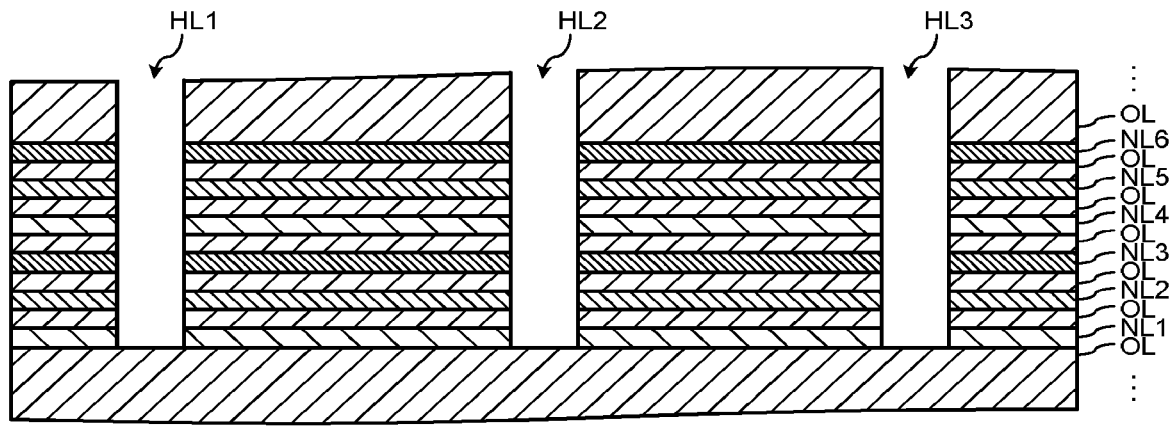
FIGS. 16A to 16C are views illustrating an example of a procedure of a method of manufacturing the semiconductor memory device according to the second embodiment.

As illustrated in FIG. 16A, a plurality of insulating layers OL and a plurality of insulating layers NL are alternately stacked on the substrate SUB such as a silicon substrate. The insulating layers NL1 to NL6 serving as the word lines WL in the subsequent replacement processing have the periodicity of the etching rate in the stacking direction as in the first embodiment. The etching rate increases in the order of the insulating layers NL3 and NL6, the insulating layers NL2 and NL5, and the insulating layers NL1 and NL4.

The plurality of contact holes HL1 to HL3 penetrating the insulating layers NL1 to NL6 and the insulating layers OL therebetween are formed by an RIE method or the like. The contact holes HL1 to HL3 have substantially equal diameters.

Figure 16B:
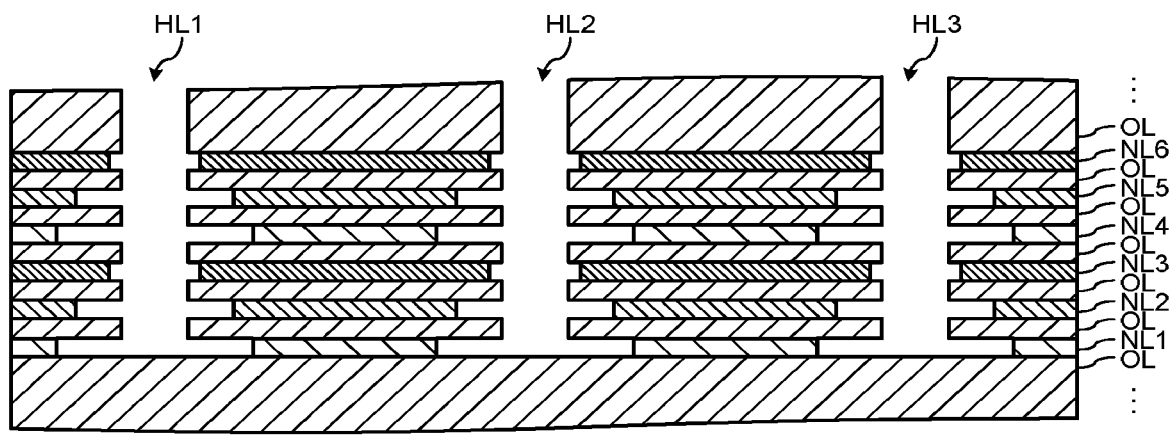

As illustrated in FIG. 16B, the substrate SUB is immersed in, for example, a wet etching solution such as hot phosphoric acid, and the insulating layers NL1 to NL6 are retreated from portions exposed to inner walls of the contact holes HL1 to HL3 by a predetermined distance. The insulating layers NL3 and NL6 are retreated from the central axes of the contact holes HL1 to HL3 by, for example, the distance D1. The insulating layers NL2 and NL5 are retreated from the central axes of the contact holes HL1 to HL3 by, for example, the distance D2, The insulating layers NL1 and NL4 are retreated from the central axes of the contact holes HL1 to HL3 by, for example, the distance D3.

Figure 16C:
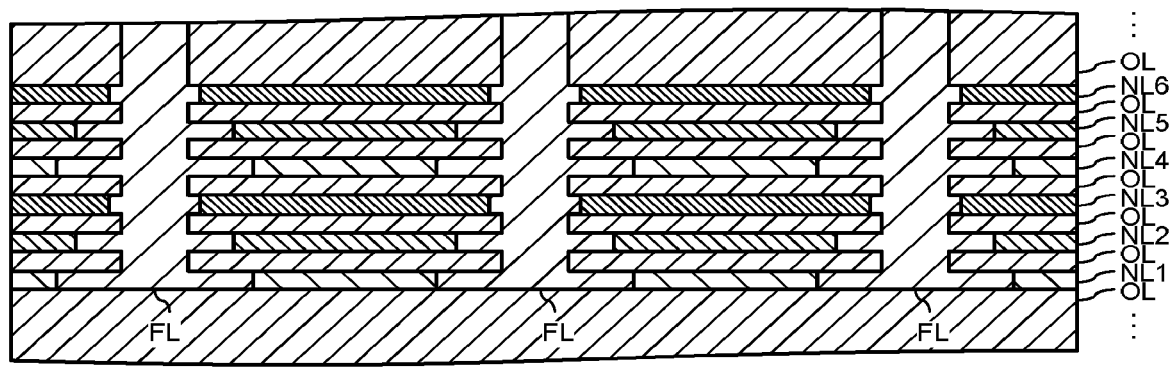

As illustrated in FIG. 16C, the contact holes HL1 to HL3 are filled with an insulating layer FL by a CVD method or the like. In this case, the insulating layer FL is formed so that the contact holes HL1 to HL3 are substantially completely filled.

Figure 17A:
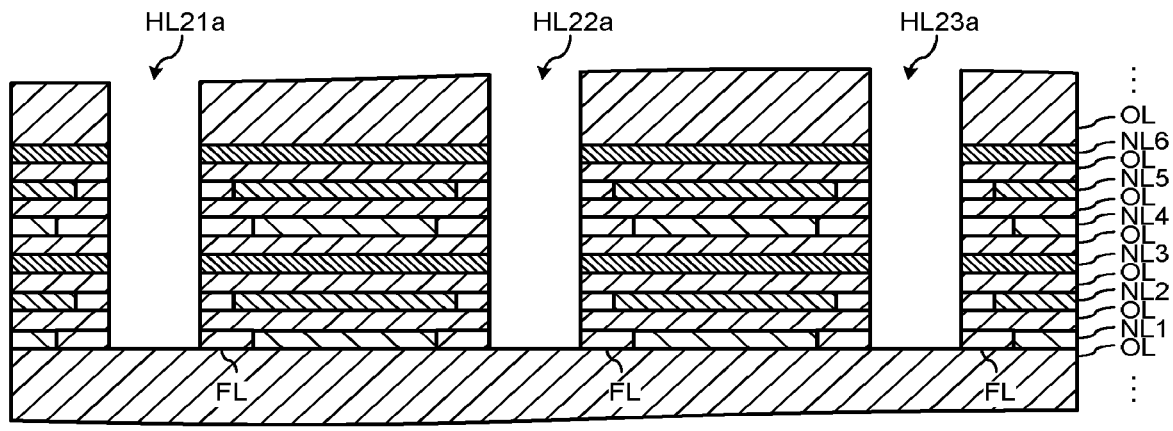
FIGS. 17A to 17C are views illustrating an example of a procedure of a method of manufacturing the semiconductor memory device according to the second embodiment.

As illustrated in FIG. 17A, the insulating layer FL is mainly penetrated by an RIE method or the like to form contact holes HL21a to HL23a having a radius of, for example, the distance D1. In this case, the insulating layers OL and the like within the distance D1 from the central axes of the contact holes HL21a to HL23a are also removed. The insulating layers FL outside the range of the distance D1 from the central axes of the contact holes HL21a to HL23a remain without being removed. The insulating layers NL3 and NL6 are exposed to the inner walls of the contact holes HL21a to HL23a.

Figure 17B:
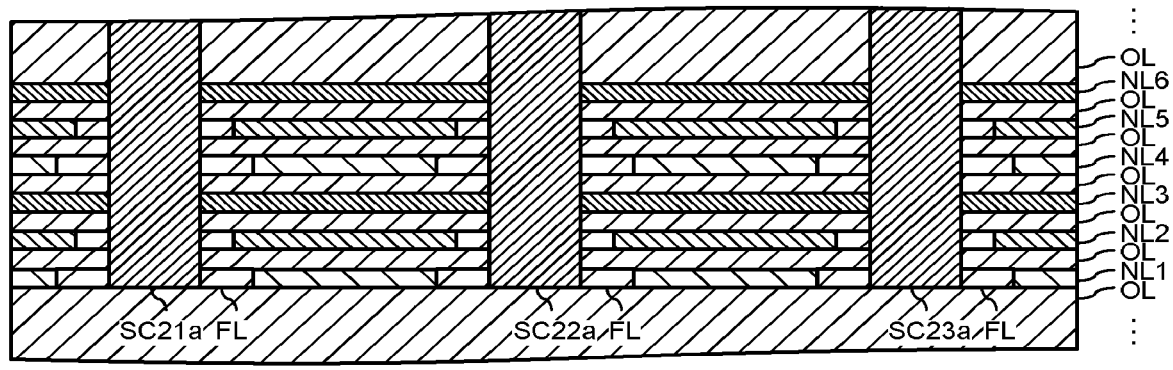

As illustrated in FIG. 17B, the contact holes HL21a to HL23a are filled with sacrificial layers SC21a to SC23a such as a silicon layer, respectively, by a CVD method or the like.

Figure 17C:
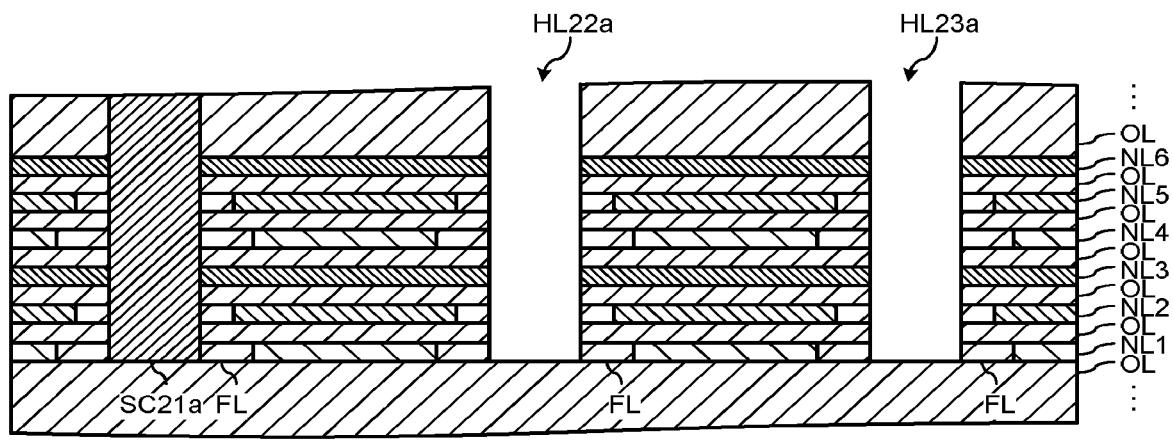

As illustrated in FIG. 17C, the sacrificial layer SC21a is covered with a mask pattern (not illustrated) such as a SiO2 layer, the substrate SUB is immersed in an aqueous alkaline solution, and the sacrificial layers SC22a and SC23a not covered with the mask pattern are removed, thereby opening the contact holes HL22a and HL23a.

Figure 18A:
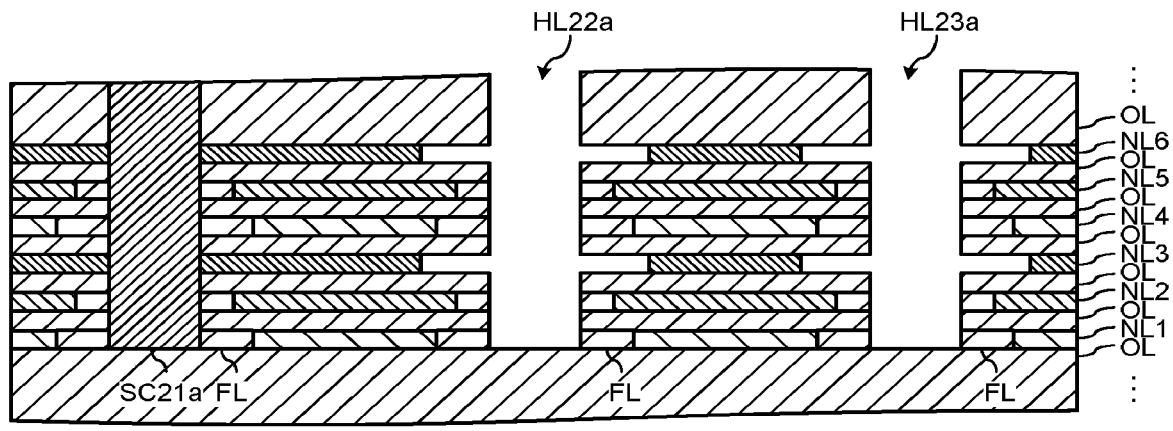
FIGS. 18A to 18C are views illustrating an example of a procedure of a method of manufacturing the semiconductor memory device according to the second embodiment.

As illustrated in FIG. 18A, the substrate SUB is immersed in, for example, a wet etching solution such as hot phosphoric acid, and the insulating layers NL3 and NL6 are retreated from portions exposed to the inner walls of the contact holes HL22a and HL23a by a predetermined distance. The insulating layers NL3 and NL6 are retreated from the central axes of the contact holes HL22a and HL23a by, for example, the distance D4.

Figure 18B:
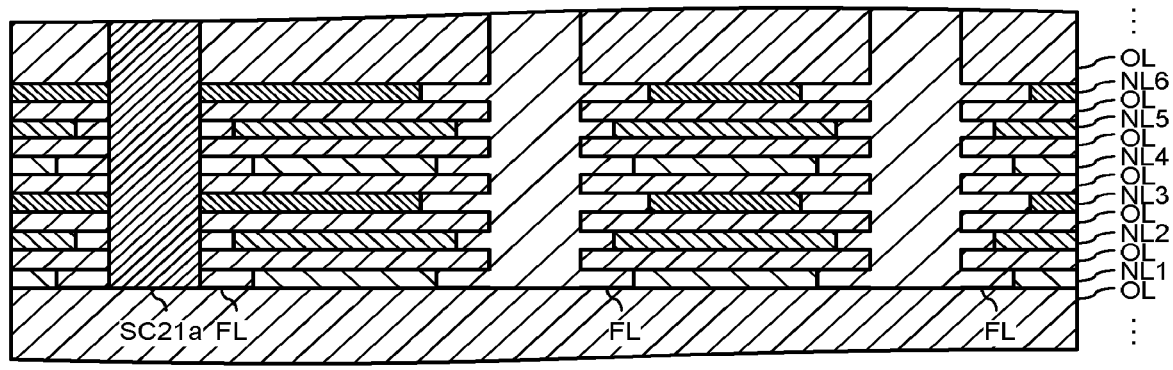

As illustrated in FIG. 18B, the contact holes HL22a and HL23a are almost completely filled with an insulating layer FL by a CVD method or the like.

Figure 18C:
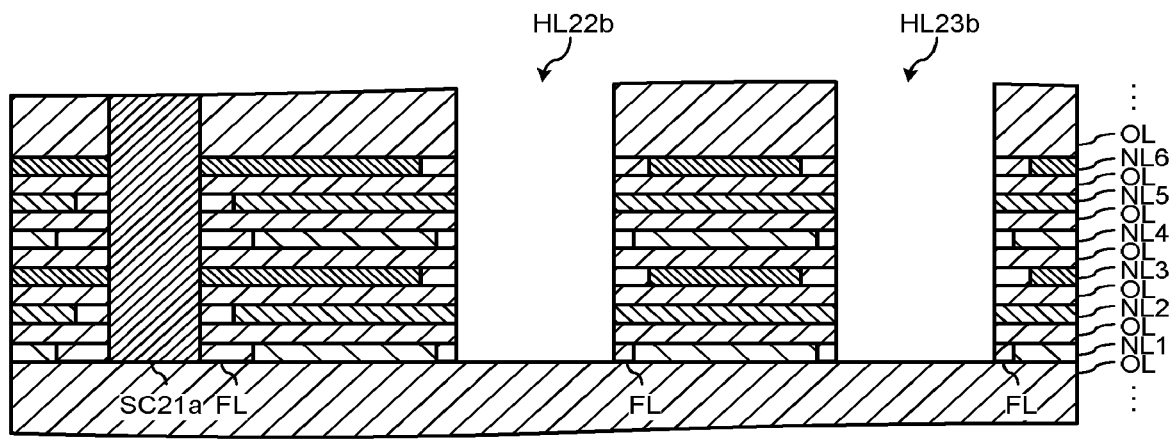

As illustrated in FIG. 18C, the insulating layer FL is mainly penetrated by an RIE method or the like to form contact holes HL22b and HL23b having a radius of, for example, the distance D2. In this case, the insulating layers OL and the like within the distance D2 from the central axes of the contact holes HL22b and HL23b are also removed. The insulating layers FL outside the range of the distance D2 from the central axes of the contact holes HL22b and HL23b remain without being removed. The insulating layers NL2 and NL5 are exposed to the inner walls of the contact holes HL22b and HL23b.

Figure 19A:
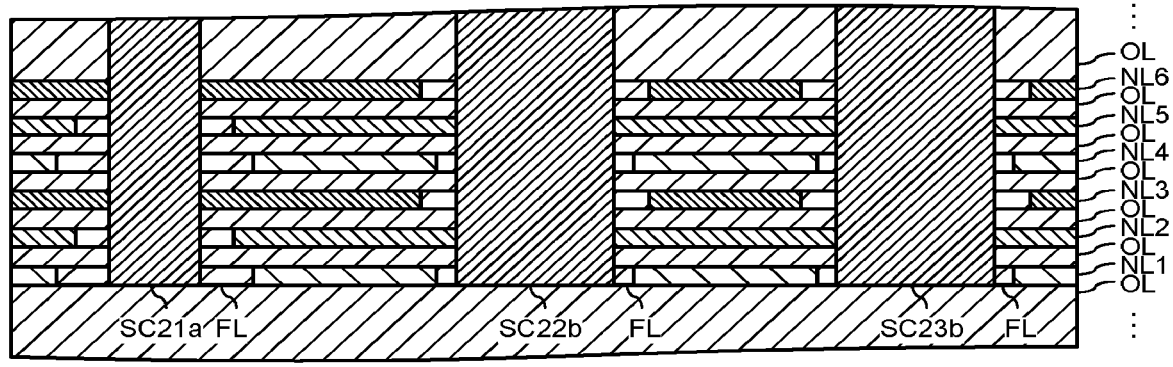
FIGS. 19A to 19C are views illustrating an example of a procedure of a method of manufacturing the semiconductor memory device according to the second embodiment.

As illustrated in FIG. 19A, the contact holes HL22b and HL23b are filled with sacrificial layers SC22b and SC23b such as a silicon layer, respectively, by a CVD method or the like.

Figure 19B:
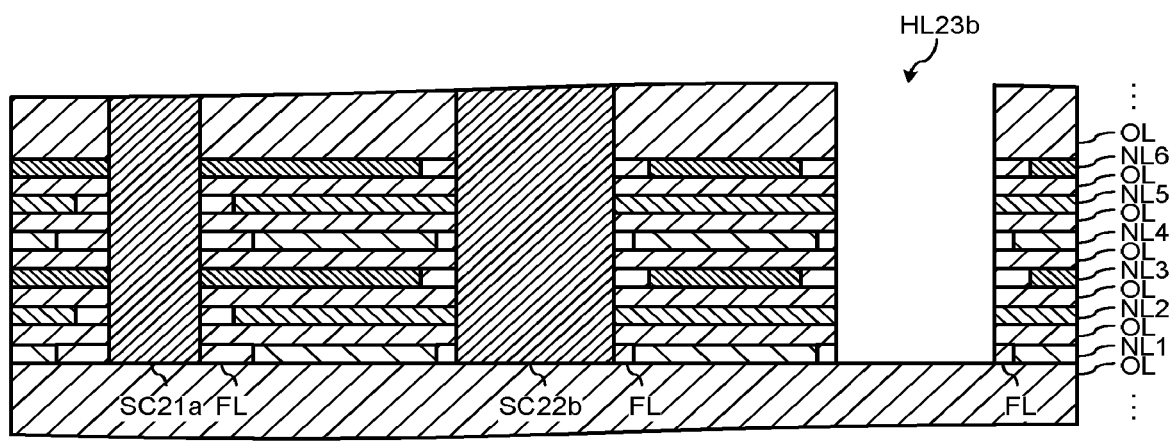

As illustrated in FIG. 19B, the sacrificial layers SC21a and SC22b are covered with a mask pattern (not illustrated) such as a SiO2 layer, the substrate SUB is immersed in an aqueous alkaline solution, and the sacrificial layer SC23b not covered with the mask pattern is removed, thereby opening the contact hole HLHL23b.

Figure 19C:
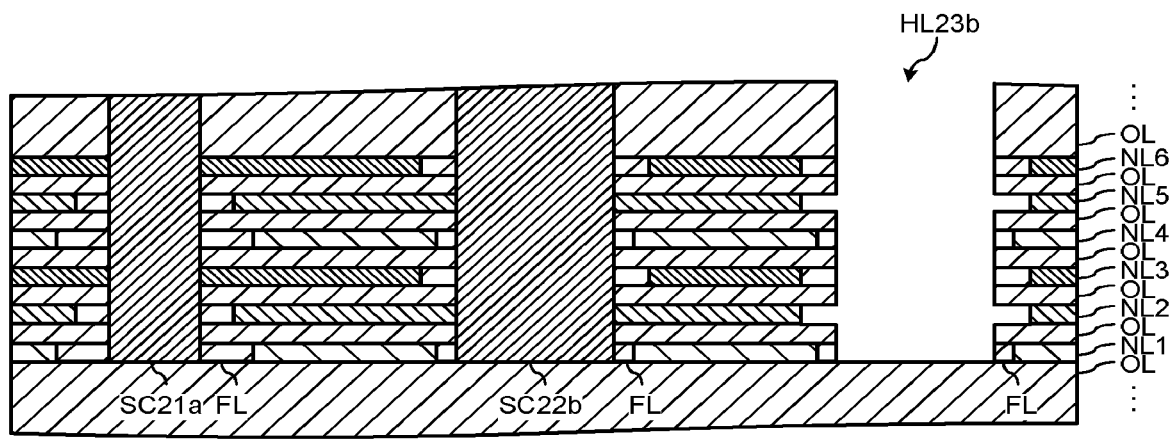

As illustrated in FIG. 19C, the substrate SUB is immersed in, for example, a wet etching solution such as hot phosphoric acid, and the insulating layers NL2 and NL5 are retreated from a portion exposed to the inner wall of the contact hole HL23b by a predetermined distance. The insulating layers NL2 and NL5 are retreated from the central axis of the contact hole HL23b by, for example, the distance D4.

Figure 20A:
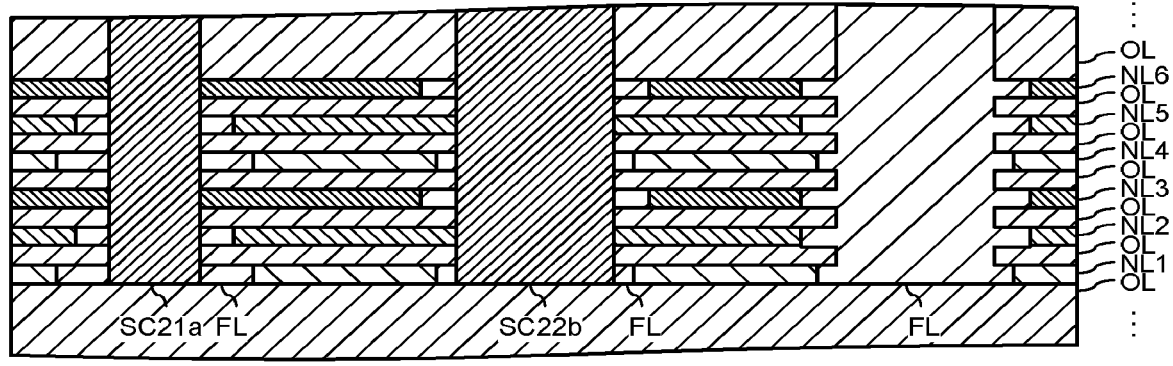
FIGS. 20A to 20C are views illustrating an example of a procedure of a method of manufacturing the semiconductor memory device according to the second embodiment.

As illustrated in FIG. 20A, the contact hole HL23b is almost completely filled with an insulating layer FL by a CVD method or the like.

Figure 20B:
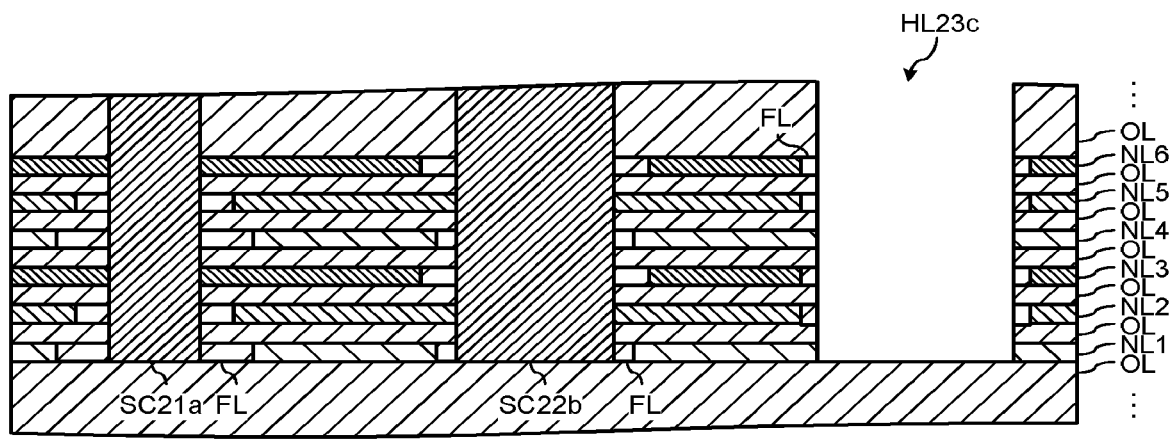

As illustrated in FIG. 20B, the insulating layer FL is mainly penetrated by an RIE method or the like to form a contact hole HL23c having a radius of, for example, the distance D3. In this case, the insulating layers OL and the like within the distance D3 from the central axis of the contact hole HL23c is also removed. The insulating layers FL outside the range of the distance D3 from the central axis of the contact hole HL23c remain without being removed. The insulating layers NL1 and NL4 are exposed to the inner wall of the contact hole HL23c.

Figure 20C:
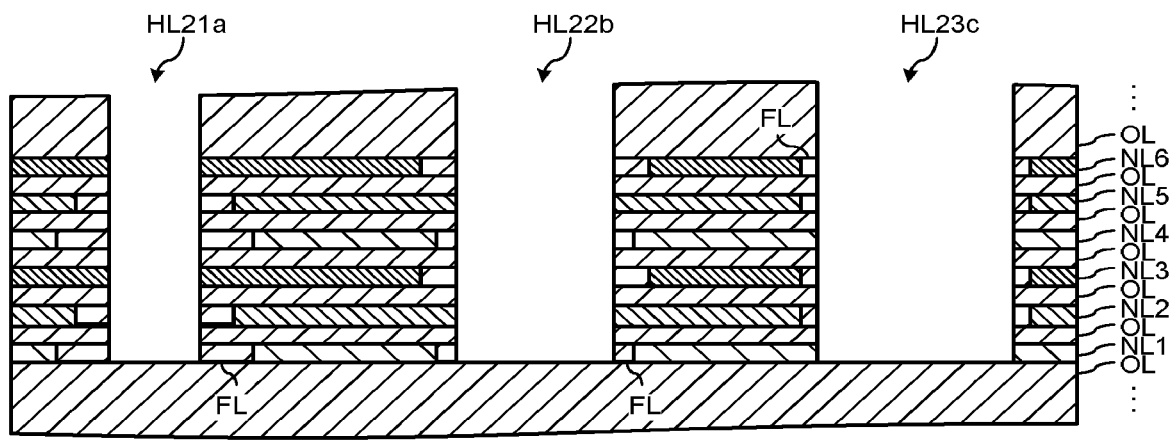

As illustrated in FIG. 20C, the substrate SUB is immersed in an aqueous alkaline solution to remove the sacrificial layers SC21a and SC22b, thereby opening the contact holes HL21a and HL22b.

Figure 21A:
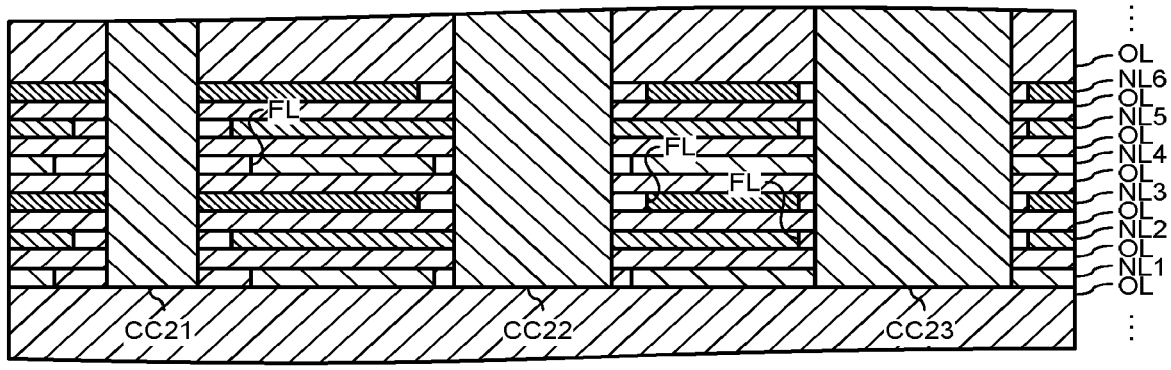
FIGS. 21A to 21C are views illustrating an example of a procedure of a method of manufacturing the semiconductor memory device according to the second embodiment.

As illustrated in FIG. 21A, the contact holes HL21a, HL22b, and HL23c are filled with a conductive material such as tungsten. Therefore, the contact plug CC21 having a radius of the distance D1, the contact plug CC22 having a radius of the distance D2, and the contact plug CC23 having a radius of the distance D3 are formed.

A groove-like slit ST extending in the X direction, penetrating from the uppermost layer to the lowermost layer of the stacked structure including the insulating layers NL1 to NL6, and reaching the substrate SUB is formed.

Figure 21B:
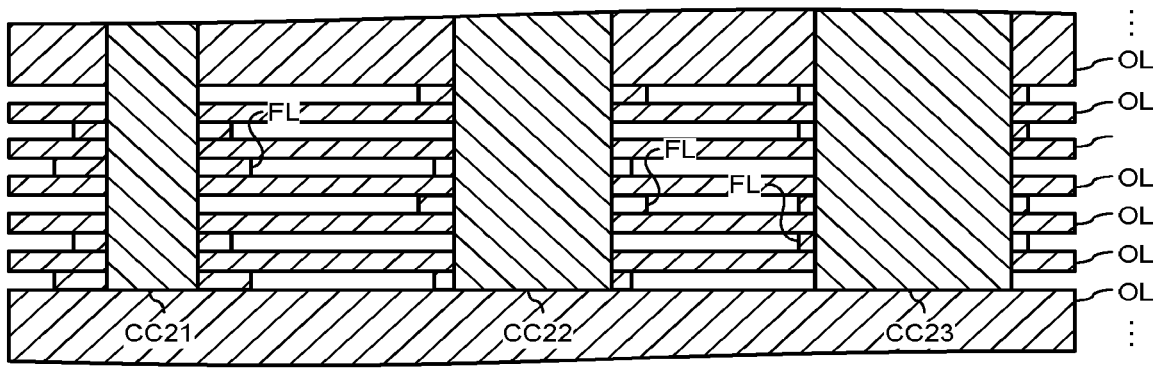

As illustrated in FIG. 21B, the insulating layers NL1 to NL6 between the insulating layers OL are removed by the slit ST. Therefore, gaps are generated between the insulating layers OL.

Figure 21C:
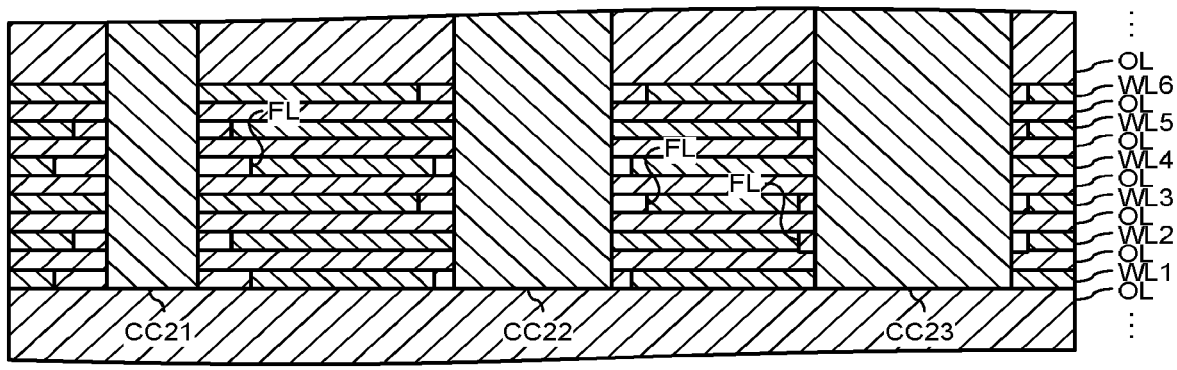

As illustrated in FIG. 21C, the gaps generated between the insulating layers OL by the slit ST are filled with a conductive material such as tungsten. Therefore, the word. lines WL1 to WL6 are formed between the insulating layers OL.

According to the semiconductor memory device 2 of the second embodiment, the same effects as those of the semiconductor memory device 1 of the first embodiment are obtained.

According to the semiconductor memory device 2 of the second embodiment, the contact plugs CC21 to CC23 that bundle the word lines WL into three sets can be obtained with a simpler process.

Note that, also in the semiconductor memory device 2 of the second embodiment, the replacement processing may be performed by a procedure corresponding to the first modification of the first embodiment.

In addition, also in the semiconductor memory device 2 of the second embodiment, three contact plugs may be arranged not only outside the cell array region but also inside the cell array region.

(Modification)

By using the method of the second embodiment, for example, the number of sets in which the word lines WL are bundled can be easily increased. In the second modification, a method of bundling the word lines WL into four sets will be described with reference to FIGS. 22A to 28C. FIGS. 22A to 28C are views each illustrating an example of a procedure of a method of manufacturing a semiconductor memory device according to a modification of the second embodiment.

As illustrated in FIG. 22A, a plurality of insulating layers OL and a plurality of insulating layers NL are alternately stacked on the substrate SUB such as a silicon substrate. The insulating layers NL1 to NL4 serving as the word lines WL in the subsequent replacement processing have the periodicity of two types of etching rates in the stacking direction. The insulating layers NL1 and NL3 are the insulating layers NI, having a high etching rate, and the insulating layers NL2 and NL4 are the insulating layers NL having a low etching rate.

In addition, insulating layers OL1 to OL4 stacked together with the insulating layers NL1 to NL4 also have periodicity of two types of etching rates in the stacking direction. The insulating layers OL1, OL3, and OL4 are the insulating layers OL having a low etching rate, and the insulating layer OL2 is the insulating layer OL having a high etching rate.

Such insulating layers OL1 to OL4 can be formed by adjusting at least one of a temperature and pressure of the substrate SUB at the time of film formation, the type and flow rate of the film-forming gas, and a concentration of impurities mixed in the insulating layers OL1 to OL4, for example, by a P-CVD method or the like.

Note that an insulating layer OL0, which is an underlayer of the insulating layers OL1 to OL4 and NL1 to NL4, has an extremely low etching rate and is hardly affected by the wet etching solution. However, the insulating layer OL0 may be the same type of layer as the insulating layers OL1, OL3, and OL4.

A plurality of contact holes HL31a to HL34a penetrating the insulating layers OL1 to OL4 and NL1 to NL4 are formed by an RIE method or the like. Here, since it is assumed that the word lines WL are bundled into four sets, four contact plugs formed of the four contact holes HL31a to HL34a are formed into one set. The contact holes HL31a to HL34a have substantially equal diameters.

As illustrated in FIG. 22B, the substrate SUB is immersed in, for example, a wet etching solution such as an aqueous hydrofluoric acid solution, and the insulating layers OL1 to OL4 are retreated from portions exposed to inner walls of the contact holes HL31a to HL34a by a predetermined distance. The insulating layers OL1, OL3, and OL4 have a low etching rate and are hardly retreated. On the other hand, the insulating layer OL2 has a high etching rate and is significantly retreated.

As illustrated in FIG. 22C, the substrate SUB is immersed in, for example, a wet etching solution such as hot phosphoric acid, and the insulating layers NL1 to NL4 are retreated from the portions exposed to the inner walls of the contact holes HL31a to HL34a by a predetermined distance. Here, the retreat amount of each of the insulating layers NL1 to NL4 is affected not only by the qualities of the respective layers but also by the surrounding environment.

For example, the insulating layers NL1 and NL4 are surrounded by the insulating layers OL0, OL1, OL3, and OL4 that are hardly retreated on both sides in the stacking direction. Therefore, the wet etching in the insulating layers NL1 and NL4 proceeds only from the end portions exposed to the inner walls of the contact holes HL31a to HL34a of the insulating layers NL1 and NL4.

On the other hand, the insulating layers NL2 and NL3 have the insulating layer OL2 largely retreated to one side in the stacking direction. Therefore, the wet etching in the insulating layers NL2 and NL3 proceeds not only from the end portions exposed to the inner walls of the contact holes HL31a to HL34a but also from surfaces of the insulating layers NL2 and NL3 exposed by the retreat of the insulating layer OL2.

Therefore, regardless of the wet etching characteristics of the insulating layers NL1 to NL4 themselves, the retreat amount of each of both the insulating layers NL1 and NL4 is smaller than those of the insulating layers NL2 and NL3. Both the insulating layers NL2 and NL3 are largely retreated as compared to the insulating layers NL1 and NL4. In addition, when the insulating layers NL1 and NL4 are compared with each other, the retreat amount of the insulating layer NL1 having a high etching rate is larger than that of the insulating layer NL4. In addition, when the insulating layers NL2 and NL3 are compared with each other, the retreat amount of the insulating layer NL3 having a high etching rate is larger than that of the insulating layer NL2.

Accordingly, the retreat amount of each of the insulating layers NL1 to NL4 is increased in the order of the insulating layer NL4, the insulating layer NL1, the insulating layer NL2, and the insulating layer NL3. The insulating layer NL4 is retreated from the central axes of the contact holes HL31a to HL34a by, for example, a distance D31. The insulating layer NL1 is retreated from the central axes of the contact holes HL31a to HL34a by, for example, a distance D32 longer than the distance D31. The insulating layer NL2 is retreated from the central axes of the contact holes HL31a to HL34a by, for example, a distance D33 longer than the distance D32. The insulating layer NL3 is retreated from the central axes of the contact holes HL31a to HL34a by, for example, a distance D34 longer than the distance D33.

Figure 23A:
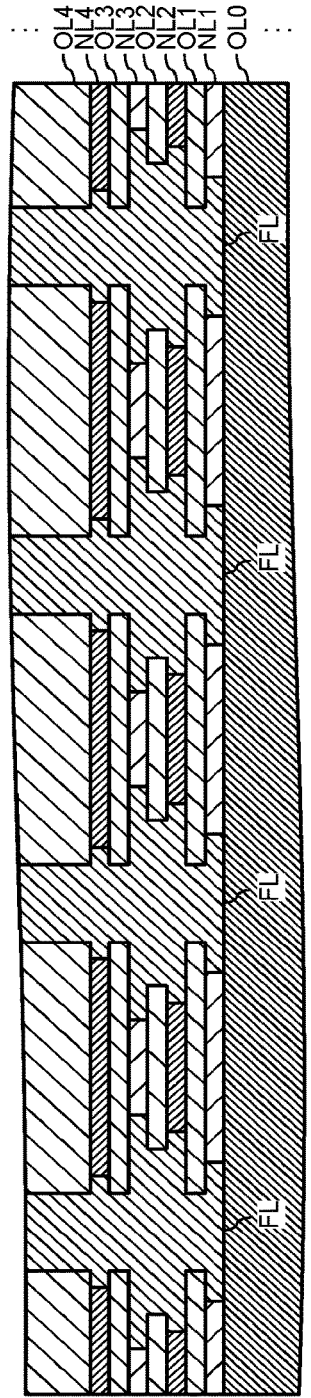
FIGS. 23A to 23C are views illustrating an example of a procedure of a method of manufacturing a semiconductor memory device according to a modification of the second embodiment.

As illustrated in FIG. 23A, the contact holes HL31a to HL34a are almost completely filled with an insulating layer FL by a CVD method or the like.

Figure 23B:
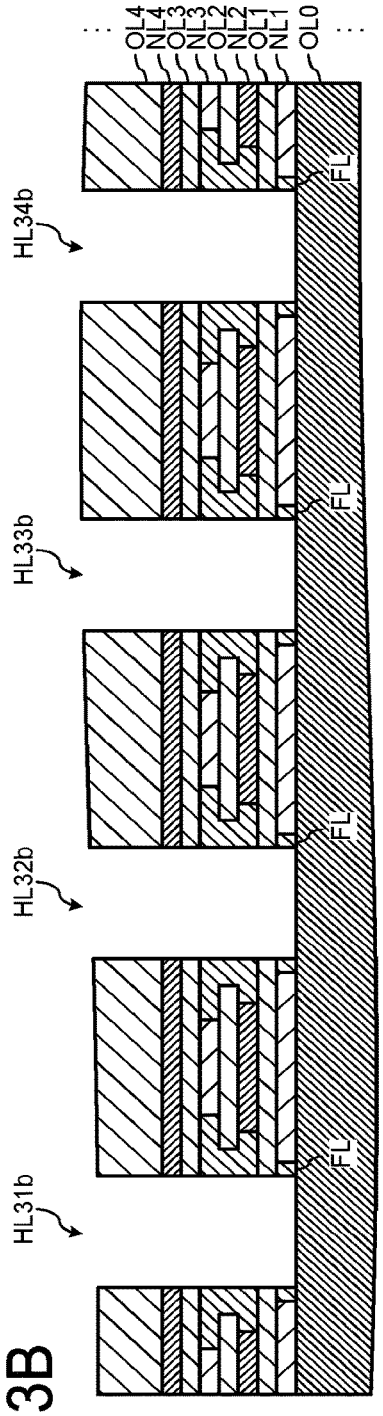

As illustrated in FIG. 23B, the insulating layer FL is mainly penetrated by an RIE method or the like to form contact holes HL31b to HL34b having a radius of, for example, the distance D31. In this case, the insulating layers OL1, OL3, and OL4 and the like within the distance D31 from the central axes of the contact holes HL31b to HL34b are also removed. The insulating layers FL outside the range of the distance D31 from the central axes of the contact holes HL31b to HL34b remain without being removed. The insulating layer NL4 is exposed to the inner walls of the contact holes HL31b to HL34b.

Figure 23C:
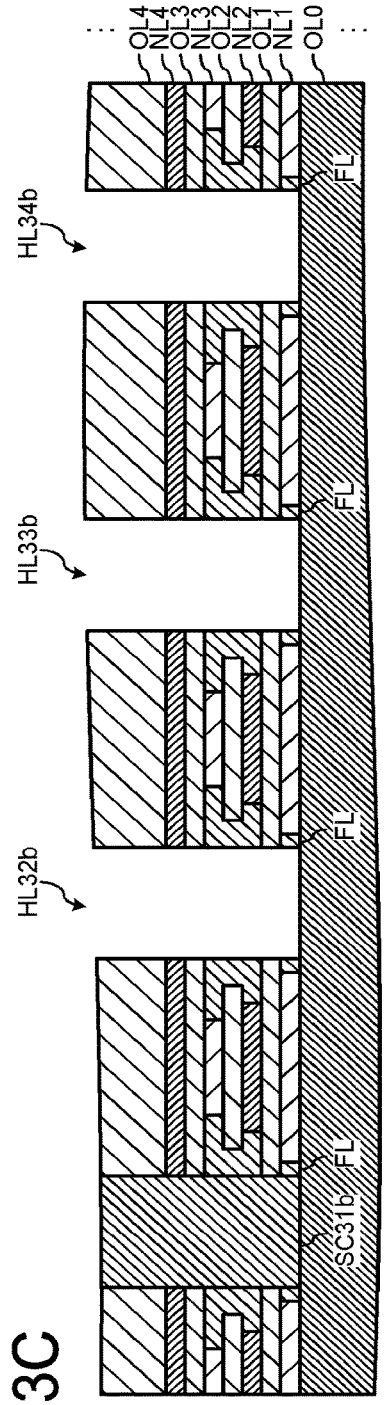

As illustrated in FIG. 23C, the contact holes HL31b to HL34b are filled with sacrificial layers SC31b to SC34b such as a silicon layer, respectively, by a CVD method or the like, and the sacrificial layer SC31b remains, thereby opening the contact holes HL32b to HL34b.

As illustrated in FIG. 24A, the substrate SUB is immersed in, for example, a wet etching solution such as hot phosphoric acid, and the insulating layer NL4 is retreated from portions exposed to the inner walls of the contact holes HL32b to HL34b by a predetermined distance. The insulating layer NL4 is retreated from the central axes of the contact holes HL32b to HL34b by, for example, a distance D35.

As illustrated in FIG. 24B, the contact holes HL32b to HL34b are almost completely filled with an insulating layer FL by a CVD method or the like.

As illustrated in FIG. 24C, the insulating layer FL is mainly penetrated by an RIE method or the like to form contact holes HL32c to HL34c having a radius of, for example, the distance D32. In this case, the insulating layers OL1, OL3, and OL4 and the like within the distance D32 from the central axes of the contact holes HL32c to HL34c are also removed. The insulating layers FL outside the range of the distance D32 from the central axes of the contact holes HL32c to HL34c remain without being removed. The insulating layer NL1 is exposed to the inner walls of the contact holes HL32c to HL34c.

Figure 25A:
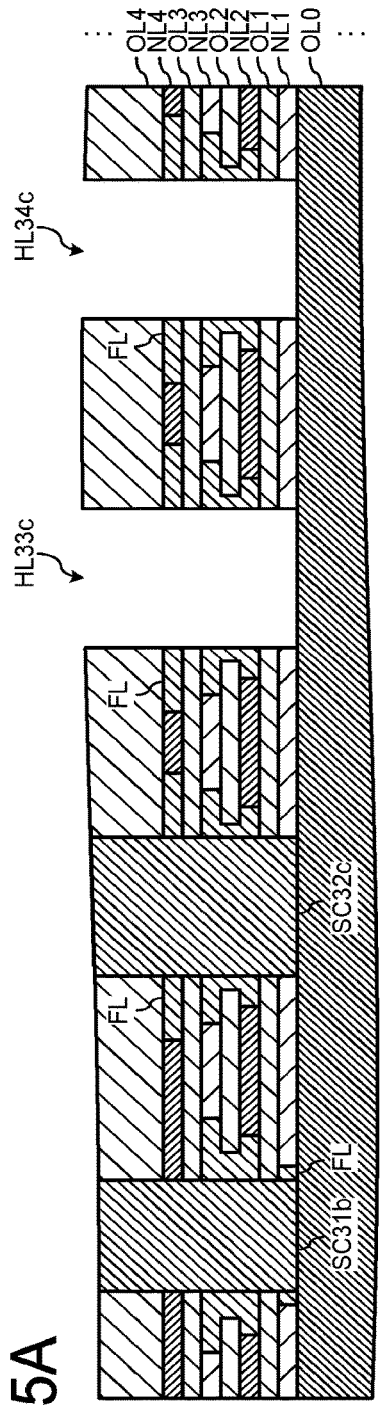
FIGS. 25A to 25C are views illustrating an example of a procedure of a method of manufacturing a semiconductor memory device according to a modification of the second embodiment.

As illustrated in FIG. 25A, the contact holes HL32c to HL34c are filled with sacrificial layers SC32c to SC34c such as a silicon layer, respectively, by a CVD method or the like, and the sacrificial layers SC31b and SC32c remain, thereby opening the contact holes HL33c and HL34c.

Figure 25B:
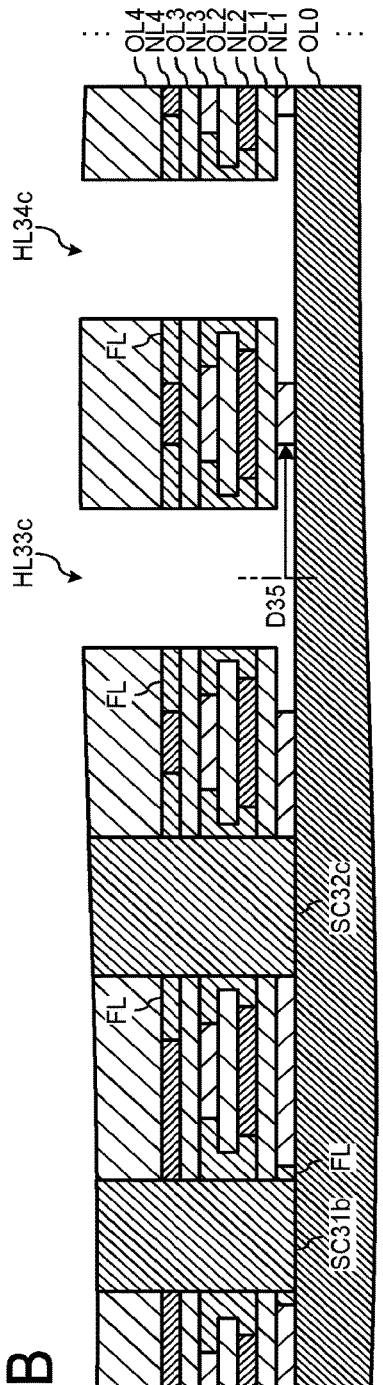

As illustrated in FIG. 25B, the substrate SUB is immersed in, for example, a wet etching solution such as hot phosphoric acid, and the insulating layer NL1 is retreated from portions exposed to the inner walls of the contact holes HL33c and HL34c by a predetermined distance. The insulating layer NL1 is retreated from the central axes of the contact holes HL33c and HL34c by, for example, the distance D35.

Figure 25C:
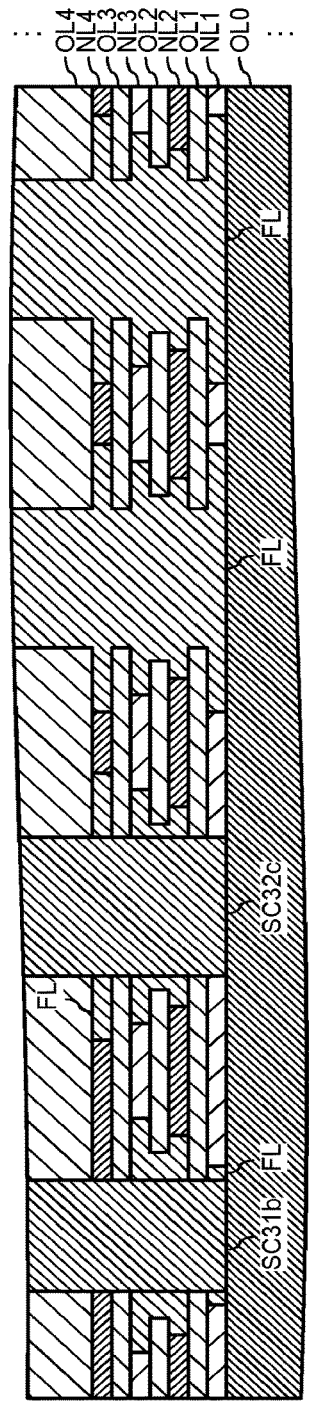

As illustrated in FIG. 25C, the contact holes HL33c and HL34c are almost completely filled with an insulating layer FL by a CVD method or the like.

Figure 26A:
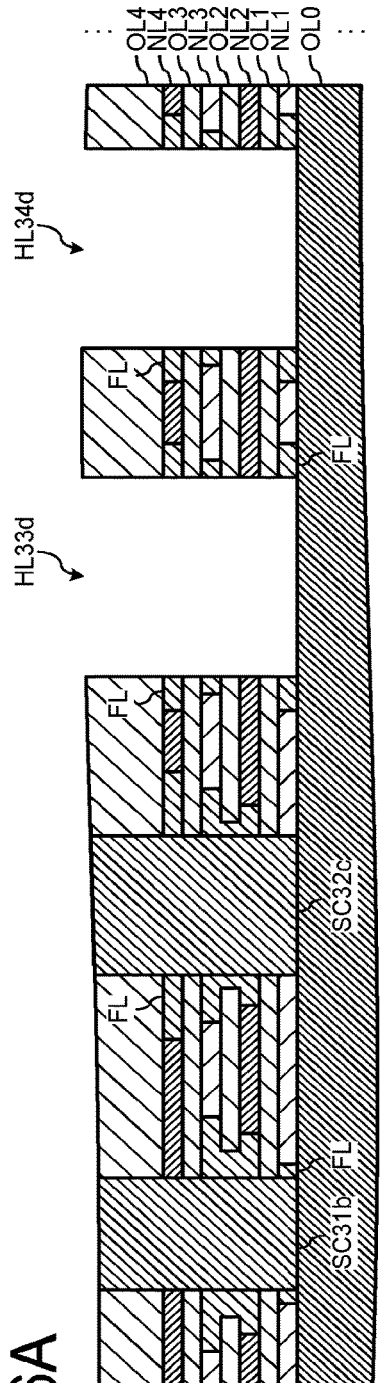
FIGS. 26A to 26C are views illustrating an example of a procedure of a method of manufacturing a semiconductor memory device according to a modification of the second embodiment.

As illustrated in FIG. 26A, the insulating layer FL is mainly penetrated by an RIE method or the like to form contact holes HL33d and HL34d having a radius of, for example, the distance D33. In this case, the insulating layers OL1 to OL4 and the like within the distance D33 from the central axes of the contact holes HL33d and HL34d are also removed. The insulating layers FL outside the range of the distance D33 from the central axes of the contact holes HL33d and HL34d remain without being removed. The insulating layer NL2 is exposed to the inner walls of the contact holes HL33d and HL34d.

Figure 26B:
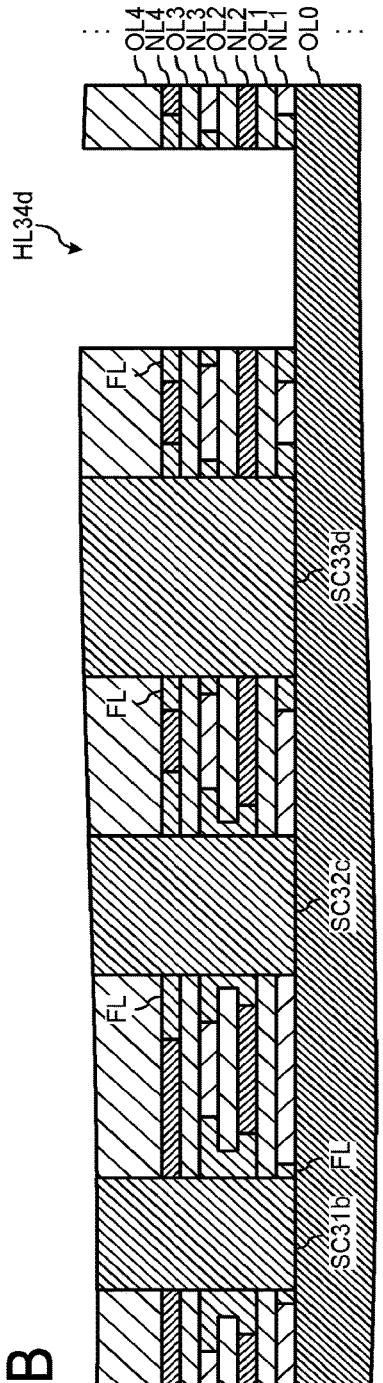

As illustrated in FIG. 26B, the contact holes HL33d and HL34d are filled with sacrificial layers SC33d and SC34d such as a silicon layer, respectively, by a CVD method or the like, and the sacrificial layers SC31b, SC32c, and SC33d remain, thereby opening the contact hole HL34d.

Figure 26C:
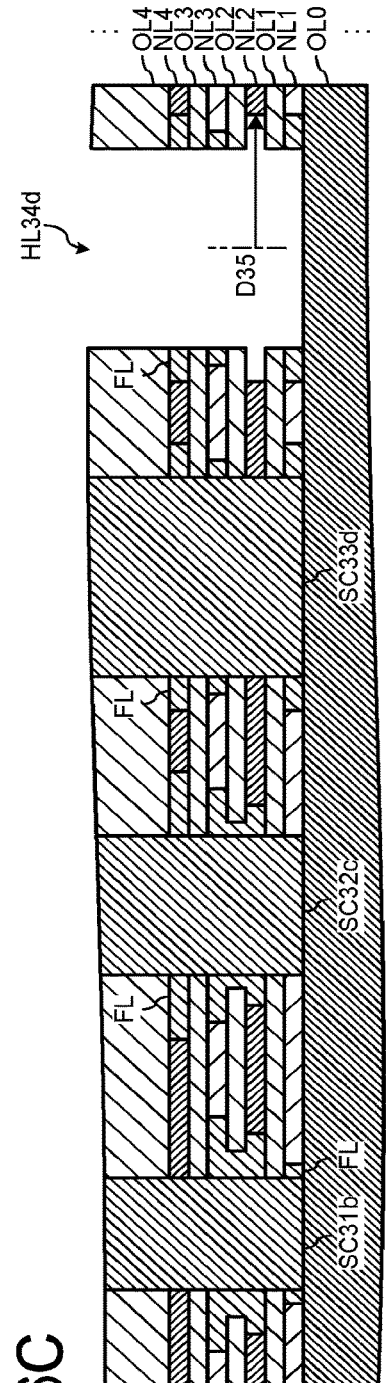

As illustrated in FIG. 26C, the substrate SUB is immersed in, for example, a wet etching solution such as hot phosphoric acid, and the insulating layer NL2 is retreated from a portion exposed to the inner wall of the contact hole HL34d by a predetermined distance. The insulating layer NL2 is retreated from the central axis of the contact hole HL34d by, for example, the distance D35.

As illustrated in FIG. 27A, the contact hole HL34d is almost completely filled with an insulating layer FL by a CVD method or the like.

As illustrated in FIG. 27B, the insulating layer FL is mainly penetrated by an RIE method or the like to form a contact hole HL34e having a radius of, for example, the distance D34. In this case, the insulating layers OL1 to OL4 and the like within the distance D34 from the central axis of the contact hole HL34e are also removed. The insulating layers FL outside the range of the distance D34 from the central axis of the contact hole HL34e remain without being removed. The insulating layer NL3 is exposed to the inner wall of the contact hole HL34e.

As illustrated in FIG. 27C, the substrate SUB is immersed in an aqueous alkaline solution to remove the sacrificial layers SC31b, SC32c, and SC33d, thereby opening the contact holes HL31b, HL32c, and HL33d.

Figure 28A:
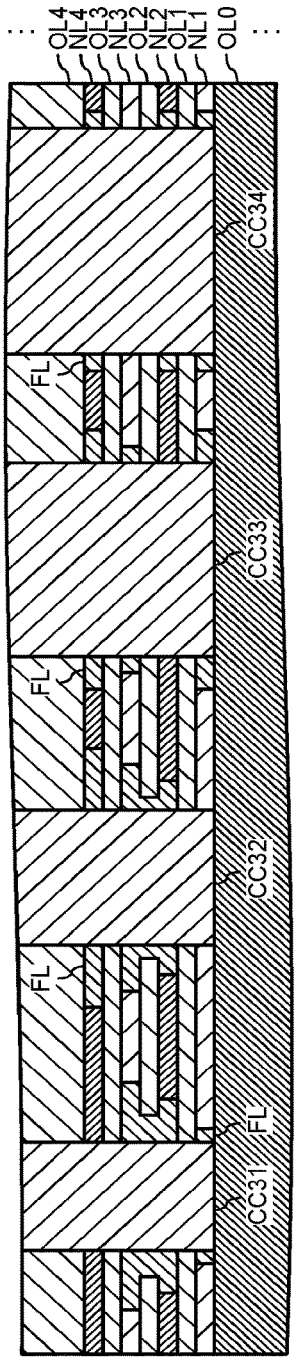
FIGS. 28A to 28C are views illustrating an example of a procedure of a method of manufacturing a semiconductor memory device according to a modification of the second embodiment.

As illustrated in FIG. 28A, the contact holes HL31b, HL32c, HL33d, and HL34e are filled with a conductive material such as tungsten. Therefore, the contact plug CC31 having a radius of the distance D31, the contact plug CC32 having a radius of the distance D32, the contact plug CC33 having a radius of the distance D33, and the contact plug CC34 having a radius of the distance D34 are formed.

A groove-like slit ST extending in the X direction, penetrating from the uppermost layer to the lowermost layer of the stacked structure including the insulating layers NL1 to NL4, and reaching the substrate SUB is formed.

Figure 28B:
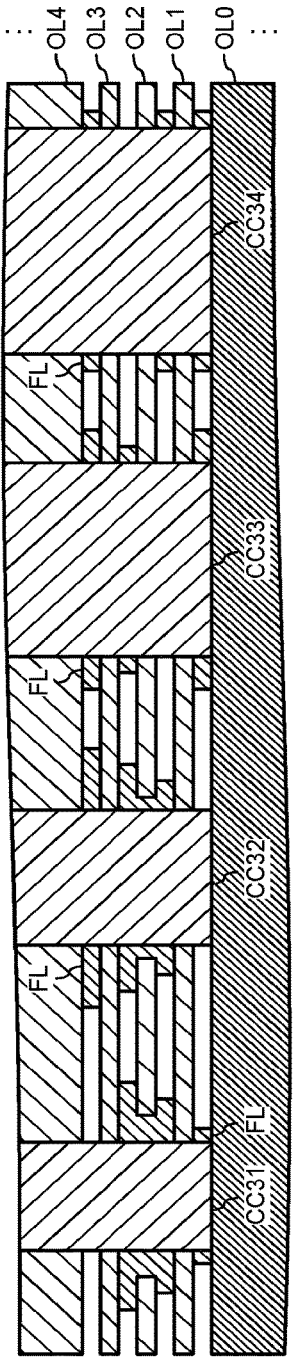

As illustrated in FIG. 28B, the insulating layers NL1 to NL4 between the insulating layers OL0 to OL4 are removed by the slit ST. Therefore, gaps are generated between the insulating layers OL0 to OL4.

Figure 28C:
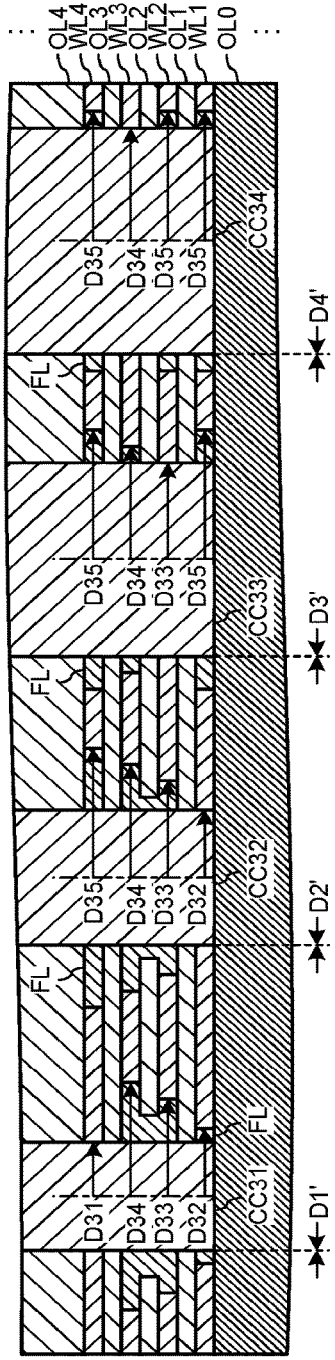

As illustrated in FIG. 28C, the gaps generated between the insulating layers OL0 to OL4 by the slit ST are filled with a conductive material such as tungsten. Therefore, the word lines WL1 to WL4 are formed between the insulating layers OL0 to OL4.

As described above, the contact plug CC31 has a diameter of the distance D31. The word line WL4 is separated from the contact plug CC31 by the distance D31. The word line WL1 is separated from the contact plug CC31 by the distance D32. The word line WL2 is separated from the contact plug CC31 by the distance D33. The word line WL3 is separated from the contact plug CC31 by the distance D34. In other words, the word line WL4 is separated from the side surface of the contact plug CC31 by the distance D1' (=0). The word lines WL1 to WL3 are separated from the side surface of the contact plug CC31 by more than the distance D1' (=0). Therefore, the contact plug CC31 is connected to the word line WL4 on the side surface of the contact plug CC31. As such, the (4n+4)th word line WL when counted from the substrate SUS side is connected to the contact plug CC31.

As described above, the contact plug CC32 has a diameter of the distance D32. The word line WL1 is separated from the contact plug CC32 by the distance D32. The word line WL2 is separated from the contact plug CC32 by the distance D33. The word line WL3 is separated from the contact plug CC32 by the distance D34. The word line WL4 is separated from the contact plug CC32 by the distance D35. In other words, the word line WL1 is separated from the side surface of the contact plug CC32 by the distance D2' (=0). The word lines WL2 to WL4 are separated from the side surface of the contact plug CC32 by more than the distance D2' (=0). Therefore, the contact plug CC32 is connected to the word line WL1 on the side surface of the contact plug CC32. As such, the (4n+1)th word line WL when counted from the substrate SUS side is connected to the contact plug CC32.

As described above, the contact plug CC33 has a diameter of the distance D33. The word line WL2 is separated from the contact plug CC33 by the distance D33. The word line WL3 is separated from the contact plug CC33 by the distance D34. The word lines WL1 and WL4 are separated from the contact plug CC33 by the distance D35. In other words, the word line WL2 is separated from the side surface of the contact plug CC33 by the distance D3' (=0). The word lines WL1, WL3, and WL4 are separated from the side surface of the contact plug CC33 by more than the distance D3' (=0). Therefore, the contact plug CC33 is connected to the word line WL2 on the side surface of the contact plug CC33. As such, the (4n+2)th word line WL when counted from the substrate SUS side is connected to the contact plug CC33.

As described above, the contact plug CC34 has a diameter of the distance D34. The word line WL3 is separated from the contact plug CC34 by the distance D34. The word lines WL1, WL2, and WL4 are separated from the contact plug CC34 by the distance D35. In other words, the word line WL3 is separated from the side surface of the contact plug CC34 by the distance D4' (=0). The word lines WL1, WL2, and WL4 are separated from the side surface of the contact plug CC34 by more than the distance D4' (=0). Therefore, the contact plug CC34 is connected to the word line WL3 on the side surface of the contact plug CC34. As such, the (4n+3)th word line WL when counted from the substrate SUS side is connected to the contact plug CC34.

As described above, when the hierarchical positions of the word lines WL are equal, that is, at the same height position of each of the contact plugs CC31 to CC34, the distance D31<D32<D33<D34 is satisfied, the diameter of the contact plug CC32 is larger than that of the contact plug CC31, the diameter of the contact plug CC33 is larger than that of the contact plug CC32, and the diameter of the contact plug CC34 is larger than that of the contact plug CC33.

According to the semiconductor memory device of the modification of the second embodiment, the number of sets in which the word lines WL are bundled can be increased by a simple manufacturing method. In addition, by using two types of layers for the insulating layers OL and NL, for example, the word lines WL can be bundled into four sets, and the number of sets in which the word lines WL are bundled can be increased with a small number of types of layers.

Note that, also in the semiconductor memory device of the modification of the second embodiment, the replacement processing may be performed by a procedure corresponding to the first modification of the first embodiment.

In addition, also in the semiconductor memory device of the modification of the second embodiment, the four contact plugs CC31 to CC34 can be arranged inside and outside the cell array region.

Other Embodiments

In the first and second embodiments and the modifications thereof, the connection structure to the contact plug CC is formed by wet etching of some types of insulating layers NL having different etching rate characteristics, but the present invention is not limited thereto. Even in a case where a metal layer, a polysilicon layer, or the like is directly used for the word line, the methods of the first and second embodiments and the modifications thereof can be applied. In this case, several types of layers having different etching rate characteristics can be obtained by adjusting the film formation conditions for these layers.

In the first and second embodiments and the modifications thereof, the peripheral circuit including the word line driver and the like can be arranged on the substrate SUB in parallel with the cell array region CA. Alternatively, regardless of the examples of the first and second embodiments and the modifications thereof, the cell array region including the pillars can be arranged not directly on the substrate but on the peripheral circuit arranged on the substrate.

While certain embodiments of the present invention have been described, these embodiments have been presented by way of example only, and are not intended to limit the scope of the inventions. Indeed, the novel embodiments may be embodied in a variety of other forms; furthermore, various omissions, substitutions, and changes in the form of the embodiments may be made without departing from the spirit of the inventions. The accompanying claims and their equivalents are intended to cover such embodiments or modifications as would fall within the scope and spirit of the inventions.

EXPLANATIONS OF LETTERS OR NUMERALS

1 Semiconductor memory device
CA Cell array region
CC1 to CC3, CC21 to CC23, CC31 to CC34 Contact plug
F1 to F3 Flange
MC Memory cell
OL, NL Insulating layer
PL Pillar
SUB Substrate
WL Word line

The invention claimed is:

1. A semiconductor memory device comprising:
a plurality of first conductive layers stacked on a substrate;
a plurality of second conductive layers each stacked between the first conductive layers;
a pillar that extends in a stacking direction of the plurality of first conductive layers and the plurality of second conductive layers and forms a plurality of memory cells at intersections of the plurality of first conductive layers and the plurality of second conductive layers in a region where the plurality of first conductive layers and the plurality of second conductive layers are arranged;
a first contact plug that extends in the stacking direction of the plurality of first conductive layers and the plurality of second conductive layers and is connected to the plurality of first conductive layers in the region where the plurality of first conductive layers and the plurality of second conductive layers are arranged; and
a second contact plug that extends in the stacking direction of the plurality of first conductive layers and the plurality of second conductive layers and is connected to the plurality of second conductive layers in the region where the plurality of first conductive layers and the plurality of second conductive layers are arranged.

2. The semiconductor memory device according to claim 1, wherein
the plurality of first conductive layers are (3n+1)th conductive layers (n is an integer of 0 or more) when counted from a substrate side, and
the plurality of second conductive layers are (3n+2)th conductive layers when counted from the substrate side.

3. The semiconductor memory device according to claim 1, wherein
the plurality of first conductive layers are (4n+1)th conductive layers (n is an integer of 0 or more) when counted from a substrate side, and
the plurality of second conductive layers are (4n+2)th conductive layers when counted from the substrate side.

4. The semiconductor memory device according to claim 1, wherein
the plurality of first conductive layers are connected to the first contact plug via a first protrusion having a first distance from a side surface of the first contact plug, and
the plurality of second conductive layers are connected to the second contact plug via a second protrusion having a second distance larger than the first distance from a side surface of the second contact plug.

5. The semiconductor memory device according to claim 1, wherein
the first contact plug has a first diameter at a first height and the second contact plug has a second diameter larger than the first diameter at the first height, and the plurality of first conductive layers are in contact with a side surface of the first contact plug and the plurality of second conductive layers are in contact with a side surface of the second contact plug.

\* \* \* \* \*